US012755754B1

(12) United States Patent
Contreras et al.

(10) Patent No.: US 12,755,754 B1
(45) Date of Patent: Oct. 6, 2026

(54) DATA STORAGE DEVICE WITH BiCMOS IMPEDANCE-MATCHED AMPLIFIER WITH TRANSDUCER-BIAS

(71) Applicant: Western Digital Technologies, Inc., San Jose, CA (US)

(72) Inventors: John T. Contreras, Palo Alto, CA (US); Jagdip Singh, The Hague (NL); Joey M. Poss, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 19/245,832

(22) Filed: Jun. 23, 2025

(51) Int. Cl.
*G11B 5/02* (2006.01)
*G11B 5/596* (2006.01)
*G11B 20/10* (2006.01)
*H03F 1/56* (2006.01)
*H03F 3/45* (2006.01)
*G11B 5/00* (2006.01)

(52) U.S. Cl.
CPC ............ *G11B 5/02* (2013.01); *G11B 5/59655* (2013.01); *H03F 1/56* (2013.01); *H03F 3/45085* (2013.01); *G11B 2005/0008* (2013.01)

(58) Field of Classification Search
CPC ........... G11B 5/012; G11B 5/127; G11B 5/00; G11B 20/0013; G11B 5/02; G11B 20/10027; G11B 5/035; G11B 20/10; G11B 5/09; H03F 1/56; H03F 3/45183; H03F 2203/45454; H03F 2203/45468; H03F 2203/45576
USPC ............................................................ 360/67
See application file for complete search history.

(56) References Cited

U.S. PATENT DOCUMENTS 11,361,786 B1 6/2022 Contreras et al.
12,021,529 B2 * 6/2024 Porter .................... H03K 3/012

* cited by examiner

*Primary Examiner* — Nabil Z Hindi
(74) *Attorney, Agent, or Firm* — NOD Law PC

(57) ABSTRACT

An amplifier for a data storage device is configured with a BiCMOS impedance-matched topology with transducer bias to amplify a differential input signal generated by a read transducer. Input nodes defined by bases of a first pair of BJTs receive the input signal, which is amplified using a second pair of BJTs having shared emitters. A differential output signal is formed at output nodes defined by cross-coupled collectors of the BJTs. The output signal is fed back to the input nodes through a feedback resistor and an emitter follower. A differential bias voltage across the read transducer is regulated based on the output signal, and a common-mode voltage is regulated based on a voltage at a center tap of a resistive divider connected between the input nodes.

20 Claims, 13 Drawing Sheets

DATA STORAGE DEVICE WITH BiCMOS IMPEDANCE-MATCHED AMPLIFIER WITH TRANSDUCER-BIAS

BACKGROUND

Data storage devices such as disk drives comprise a magnetic storage medium such as a disk and a recording (read/write) head connected to a distal end of an actuator arm that is rotated about a pivot by an actuator such as a voice coil motor (VCM) to position the recording head radially at a carefully controlled fly height over the disk. The disk comprises a plurality of radially spaced, concentric tracks for recording user data sectors and servo sectors. The servo sectors comprise head positioning information (e.g., a track address) that is read by the recording head and processed by a servo control system to control the actuator arm as it seeks from track to track. A disk drive typically comprises a plurality of disks each having a top and bottom surface accessed by a respective recording head. The actuator typically rotates a number of actuator arms about a pivot in order to simultaneously position a number of recording heads over respective disk surfaces based on the servo data recorded on each disk surface.

FIG. 1 is a conceptual diagram of a conventional disk format 2 comprising a number of servo tracks 4 defined by servo sectors $\mathbf{6}_0 \ldots \mathbf{6}_N$ recorded around the circumference of each servo track 4. Each servo sector $\mathbf{6}_i$ comprises a preamble 8 for storing a periodic pattern that allows proper gain adjustment and timing synchronization of the read signal, and a sync mark 10 for storing a special pattern used to symbol synchronize to a servo data field 12. Servo data field 12 stores coarse head positioning information, such as a servo track address, used to position the head over a target data track during a seek operation. Each servo sector $\mathbf{6}_i$ further comprises groups of servo bursts 14 (e.g., N and Q servo bursts) that are recorded with a predetermined phase relative to one another and relative to the servo track centerlines. The phase-based servo bursts 14 provide fine head positioning information used for centerline tracking while accessing a data track during read and write operations. A position error signal (PES) generated by reading servo bursts 14 represents a measured position of the recording head relative to a centerline of a target servo track. A servo controller processes the PES to generate a control signal applied to the actuator to actuate the recording head radially over the disk in a direction that reduces the PES.

As data rates and areal densities continue to rise in modern data storage systems, the analog front-end circuitry that processes and amplifies signals from the read head is subject to increasingly stringent performance requirements. To accommodate narrower data tracks, the physical dimensions of the read transducer must be reduced. This downward scaling decreases the available cross-sectional area for current conduction, resulting in higher transducer resistance. Increased transducer resistance contributes to greater electronic noise, impedance mismatch, and signal distortion, all of which degrade signal integrity and complicate data recovery. Front-end amplifier designs must not only address these challenges but also provide compatibility with integrated circuit (IC) fabrication processes currently being used in read channel preamplifiers. Modern preamplifiers frequently employ BiCMOS (Bipolar Complementary Metal-Oxide Semiconductor) technology, which supports integration of both bipolar and CMOS devices.

The description provided in this background section should not be assumed to be prior art merely because it is mentioned in or associated with this background section. The background section may include information that describes one or more aspects of the subject technology.

SUMMARY

The following summary relates to one or more aspects or embodiments disclosed herein. It is not an extensive overview relating to all contemplated aspects or embodiments, and should not be regarded as identifying key or critical elements of all contemplated aspects or embodiments, or as delineating the scope associated with any particular aspect or embodiment. The following summary has the sole purpose of presenting certain concepts relating to one or more aspects or embodiments disclosed herein in a simplified form to precede the detailed description that follows.

Some aspects of this disclosure are directed to a data storage device comprising a magnetic media, a recording head comprising a read transducer configured to generate a differential read signal in response to magnetic bit transitions on the magnetic media, and an amplifier coupled to the recording head via a transmission line. The amplifier comprises a first pair of bipolar junction transistors (BJTs) and a second pair of BJTs. Bases of the first pair of BJTs define input nodes configured to receive the differential read signal from the read transducer via the transmission line. Bases of the second pair of BJTs are coupled to a bias voltage source, emitters of the second pair of BJTs are coupled to emitters of the first pair of BJTs, and collectors of the second pair of BJTs are cross-coupled to collectors of the first pair of BJTs to define output nodes at which a differential output signal of the amplifier is formed. A feedback resistor and an emitter follower are coupled between the output nodes and the input nodes, with the input impedance of the amplifier being tunable by the feedback resistor. A differential biasing circuit comprising an operational transconductance amplifier (OTA) configured to receive the differential output signal and to drive a pair of differential current sources is coupled to the input nodes to apply a differential bias voltage across the read transducer via the transmission line.

In some implementations, the OTA is further configured to receive an inverted version of the differential output signal and to regulate the differential output signal toward a quiescent value of approximately zero volts.

In some implementations, the emitters of the second pair of BJTs are capacitively cross-coupled to the bases of the second pair of BJTs.

In some implementations, the amplifier further comprises a voltage regulator configured to generate a supply voltage for the amplifier. The voltage regulator comprises a scaled bias current source; a scaled load resistor coupled in series with the scaled bias current source; a scaled reference BJT having a collector and a base coupled to the scaled load resistor and defining a reference node at which a reference supply voltage is developed; at least one voltage source coupled to an emitter of the scaled reference BJT; and a buffer amplifier having an input coupled to the reference node and an output at which the supply voltage is developed.

In some implementations, the at least one voltage source of the regulator comprises a common-mode bias voltage source corresponding to an input common-mode voltage of the amplifier, and an offset voltage source configured to establish sufficient voltage headroom to maintain active region operation of the BJTs within the amplifier.

In some implementations, the scaled bias current source is scaled by a factor of 1/k relative to a bias current source of the amplifier, the scaled load resistor is scaled by a factor of k relative to a load resistor of the amplifier, and the scaled reference BJT is scaled by a factor of 1/k', wherein $k'=(I_{EF}/I_1)\times k$, $I_{EF}$ is a bias current applied to the emitter follower, and $I_1$ is a bias current applied to the emitters of the first and second pairs of BJTs.

In some implementations, the amplifier further comprises an emitter follower biasing circuit configured to set a base voltage of the emitter follower. The emitter follower biasing circuit comprises a scaled reference transistor, a scaled bias current source coupled to a collector and to a base of the scaled reference transistor, and a bias resistor coupled between the collector and the base of the scaled reference transistor and a base of the emitter follower.

In some implementations, the emitter follower biasing circuit further comprises an AC coupling capacitor coupled to the base of the emitter follower.

Other aspects of this disclosure are directed to a data storage device comprising a magnetic media, a recording head comprising a read transducer configured to generate a differential read signal in response to magnetic bit transitions on the magnetic media, and an amplifier coupled to the recording head via a transmission line. The amplifier comprises a first pair of bipolar junction transistors (BJTs) and a second pair of BJTs. Bases of the first pair of BJTs define input nodes configured to receive the differential read signal from the read transducer via the transmission line. Bases of the second pair of BJTs are coupled to a bias voltage source, emitters of the second pair of BJTs are coupled to emitters of the first pair of BJTs, and collectors of the second pair of BJTs are cross-coupled to collectors of the first pair of BJTs to define output nodes at which a differential output signal of the amplifier is formed. A feedback resistor and an emitter follower are coupled between the output nodes and the input nodes, with the input impedance of the amplifier being tunable by the feedback resistor. A common-mode biasing circuit comprises an operational transconductance amplifier (OTA) configured to compare a common-mode input voltage of the input nodes to a reference voltage and to drive a pair of common-mode current sources coupled to the input nodes to regulate the common-mode input voltage.

In some implementations, the common-mode biasing circuit further comprises a common-mode resistive voltage divider connected between the input nodes having a midpoint from which the OTA obtains the common-mode input voltage of the input nodes.

Further aspects of this disclosure are directed to a method for amplifying a differential read signal generated across a read transducer of a data storage device. The method comprises applying the differential read signal across input nodes defined by bases of a first pair of bipolar junction transistors (BJTs); amplifying the differential read signal using a second pair of BJTs having emitters coupled to emitters of the first pair of BJTs; forming a differential output signal at output nodes defined by cross-coupled collectors of the first and second pairs of BJTs; feeding the differential output signal back to the input nodes through a feedback resistor and an emitter follower, wherein the feedback resistor is configured to tune an input impedance of the amplifier; regulating a differential bias voltage across the read transducer based on the differential output signal; and regulating a common-mode voltage at the input nodes based on a voltage sensed at a center tap of a resistive divider connected between the input nodes.

Various additional aspects of this disclosure are described below and depicted in the accompanying figures and will be further apparent based thereon.

BRIEF DESCRIPTION OF THE DRAWINGS

Various features and advantages of this disclosure will be apparent from the following description and accompanying drawings. The drawings are not necessarily to scale; emphasis instead is placed on illustrating the principles of this disclosure. In the drawings, like reference characters may refer to the same parts throughout the different views. The drawings depict only illustrative examples of this disclosure and are not limiting in scope.

DETAILED DESCRIPTION

The words "exemplary" and "example" as used herein mean "serving as an example, instance, or illustration." Any embodiment described herein as "exemplary" or as an "example" should not be construed as preferred or advantageous over other embodiments. It is also noted that the use of the term "coupled" and/or "couple" throughout this disclosure and the claims does not require direct or immediate coupling and that additional intervening elements can be present between the circuit elements described as being coupled.

The embodiments described herein do not limit the invention to the precise form disclosed, nor are they exhaustive. Rather, various embodiments are presented to provide a description for utilization by others skilled in the art. Technology continues to develop, and elements of the disclosed embodiments may be replaced by improved and enhanced items. This disclosure inherently discloses elements incorporating technology available at the time of this disclosure.

Figure 1:
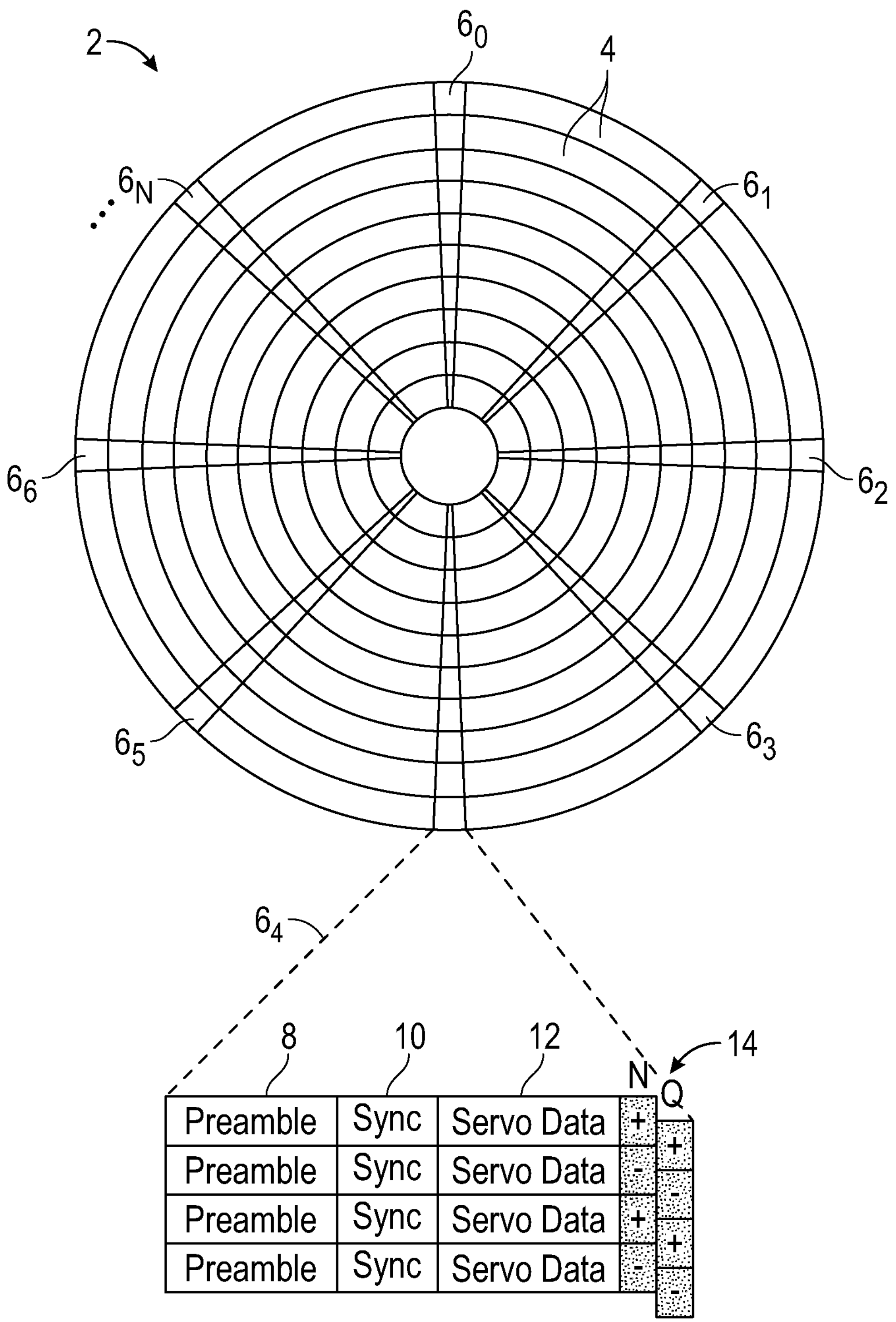
FIG. 1 is a conceptual diagram of a conventional disk format, in accordance with aspects of this disclosure.
Figure 2A:
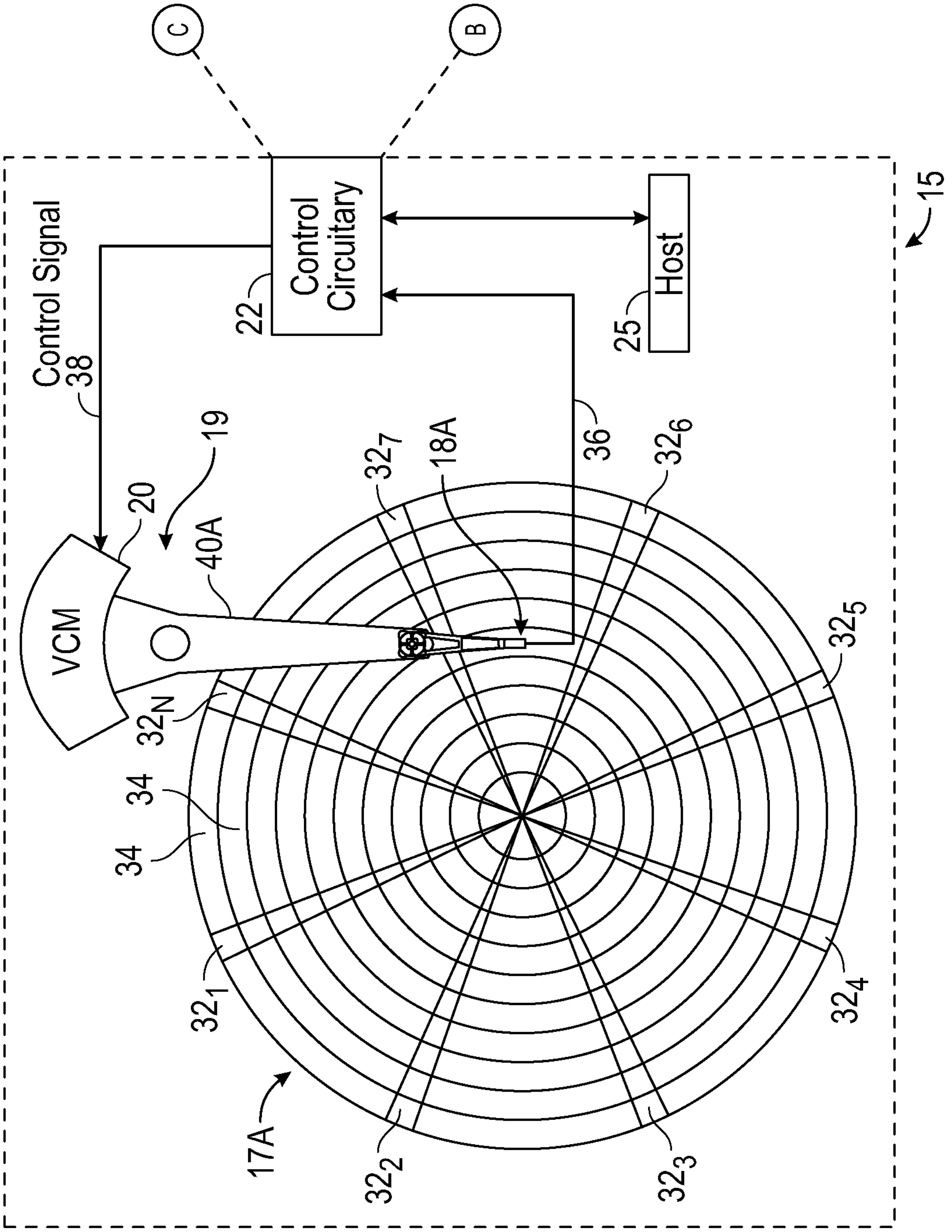
FIG. 2A is a conceptual diagram of a top view of a data storage device in the form of a hard disk drive (HDD), in accordance with aspects of this disclosure.
Figure 2B:
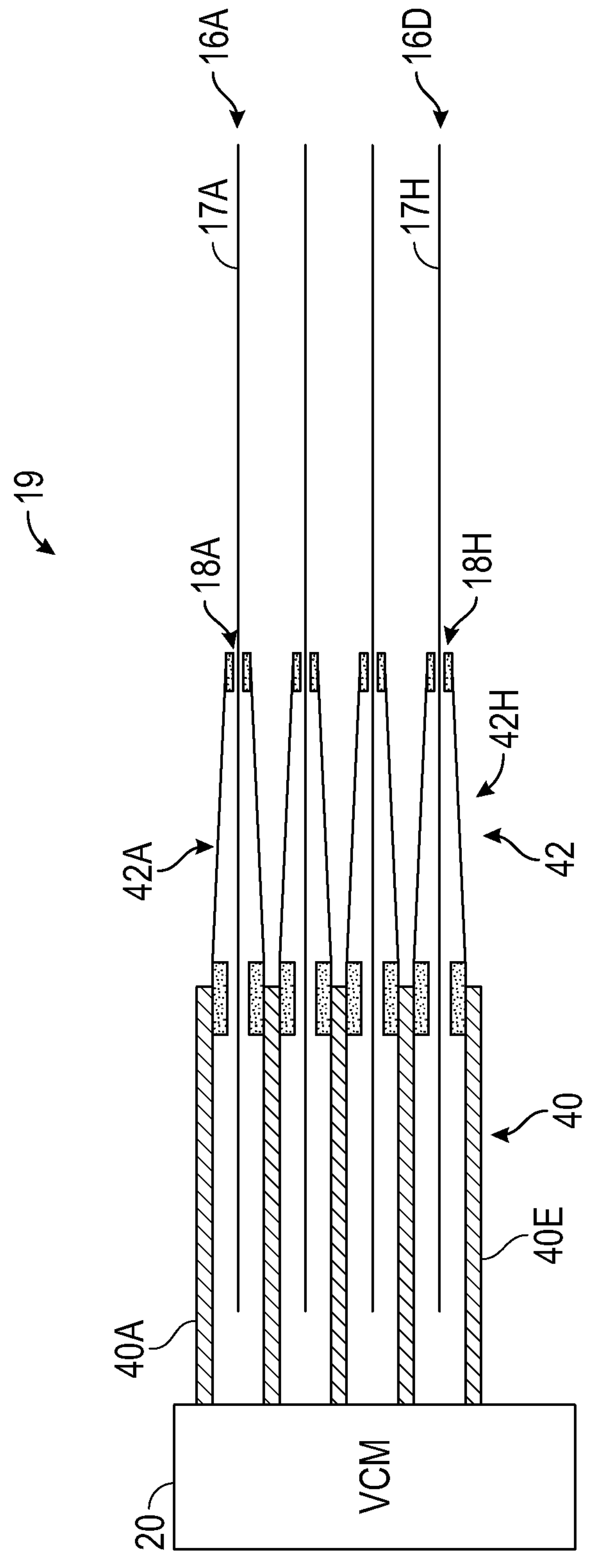
FIG. 2B is a conceptual diagram of a side view of a data storage device in the form of an HDD, in accordance with aspects of this disclosure.

FIGS. 2A and 2B are conceptual top and side views of a data storage device in the form of hard disk drive (HDD) 15, in accordance with aspects of this disclosure. HDD 15 comprises recording heads 18 (recording heads 18A . . . 18H) that are actuated and positioned over surfaces 17 (surfaces 17A . . . 17H) of magnetic storage media 16 (disks 16A . . . 16D) by actuator assembly 19. Each recording head 18 includes write and read elements configured for writing and reading data and control features to and from disk surfaces 17. In particular, the read element comprises a tunneling magnetoresistive (TMR) read transducer that senses magnetic bit transitions on the surface of the disk, producing a differential voltage in response.

Actuator assembly 19 comprises primary actuator 20, which is typically a voice coil motor (VCM), and a number of actuator arms 40 (actuator arms 40A . . . 40E). Each recording head 18 is configured in a slider at a distal end of an actuator arm 40 via a suspension 42 (suspensions 42A . . . 42H), which provides mechanical support for recording head 18 and also serves as placement for a transmission line to route write and read signals between head 18 and downstream electronics. Each actuator arm 40 is configured to suspend a head 18 in close proximity over a corresponding disk surface 17. For example, head 18A is suspended by topmost actuator arm 40A via suspension 42*a* over topmost disk surface 17A, and head 18H is suspended by lowest actuator arm 40H via suspension 42H over lowest disk surface 17H. FIGS. 2A-B are presented for exemplary purposes only; a wide variety of other numbers of disks, disk surfaces, primary actuators, actuator assemblies, suspensions, and heads are contemplated and may be used.

Control circuitry 22 may be implemented in one or more processing devices and performs or executes various methods, processes, functions, and tasks to manage and control operation of HDD 15, and in particular to manage and control read and write operations. Some aspects of control circuitry 22 are illustrated in FIG. 2C, which is a block diagram 50 conceptually illustrating an exemplary signal flow architecture of a data storage device such as HDD 15, in accordance with aspects of this disclosure. The read/write path comprises components of control circuitry 22, including system-on-a-chip (SoC) 60 and preamplifier 70. Diagram 50 conceptually illustrates how host or user data travels through HDD 15 for read and write operations.

During a write operation, data is recorded on surface 17 of rotating magnetic media 16. Data from host 25 or another user is supplied as write data 52 to SoC 60, which may be configured on the main printed circuit board (PCB) of HDD 15. Within SoC 60, write signal processing circuitry 62 performs tasks on write data 52 such as data formatting, channel encoding, encryption, and other write-side signal conditioning tasks. The processed write data is then routed to preamplifier 70, which is typically positioned as close as possible to the read/write heads to minimize noise and signal degradation. In some examples, preamplifier 70 may be implemented in an integrated circuit (IC) configured on or near actuator assembly 19. Write driver 72 of preamplifier 70 converts the processed write data received from SoC 60 into a modulated current waveform suitable for driving write head 82. Also included within preamplifier 70 is HDI controller 76, which manages interaction with HDI transducers 86. HDI controller 87 governs signal routing, gain selection, bias configuration, and other functions necessary for read and write functionality.

The current waveform generated by preamplifier 70 is routed through a transmission line to write head 82, specifically, to a write transducer within HDI transducers 86. In some examples, the transmission line between preamplifier 70 and HDI transducers 86 is implemented in a flex cable assembly configured along suspension 42. The write transducer applies these current pulses to an inductive coil, generating a localized magnetic field strong enough to magnetize a bit of magnetic material in disk surface 17. The direction of magnetization, which is determined by the polarity of the current pulse, encodes a binary one or zero, thereby recording write data 52 onto disk 16.

During a read operation, previously recorded data is retrieved from disk surface 17. Read head 84 includes a tunneling magneto-resistive (TMR) read transducer that is configured within HDI transducers 86. As disk 16 spins beneath read head 84, the read transducer resistance varies according to the magnetic orientation of recorded bits along the data track. These changes in the read transducer resistance reflect the binary states of the magnetized bits and modulate the voltage across the transducer when a bias current is applied. The resulting analog read signal (the differential voltage across the read transducer) is routed to preamplifier 70 through a transmission line that may be implemented in a flex cable assembly configured along suspension 42.

The analog read signal is received by low-noise amplifier (LNA) 74 of preamplifier 70. Various implementations of amplifier 74 are described in detail below, including BIMAT (BiCMOS Impedance-Matched Amplifier with Transducer-bias) amplifier 500 of FIG. 10A. The read signal as amplified by amplifier 74 is delivered to SoC 60 for further processing by read signal processing circuitry 64. SoC 60 may perform functions such as equalization, timing recovery, decryption, de-formatting, and error correction to reconstruct the recorded data. The processed data is output to host 25 or another user as read data 52.

Figure 2D:
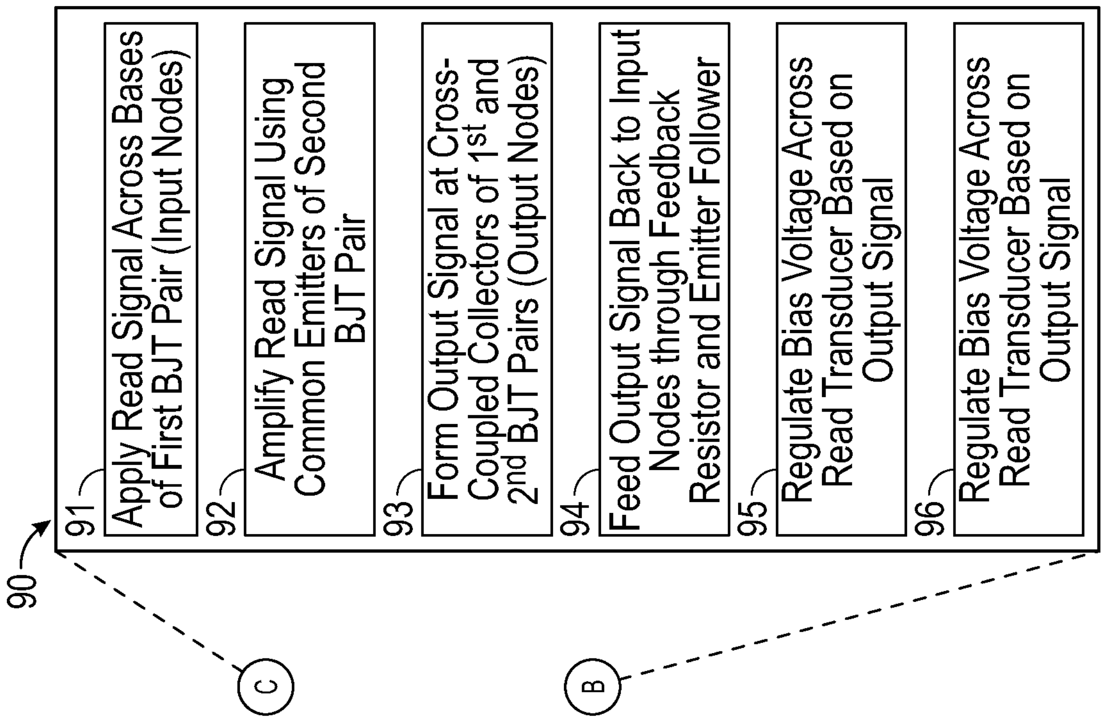
FIG. 2D is a flow diagram depicting a method for amplifying a differential read signal generated across a read transducer of a data storage device, in accordance with aspects of this disclosure.
Figure 2C:
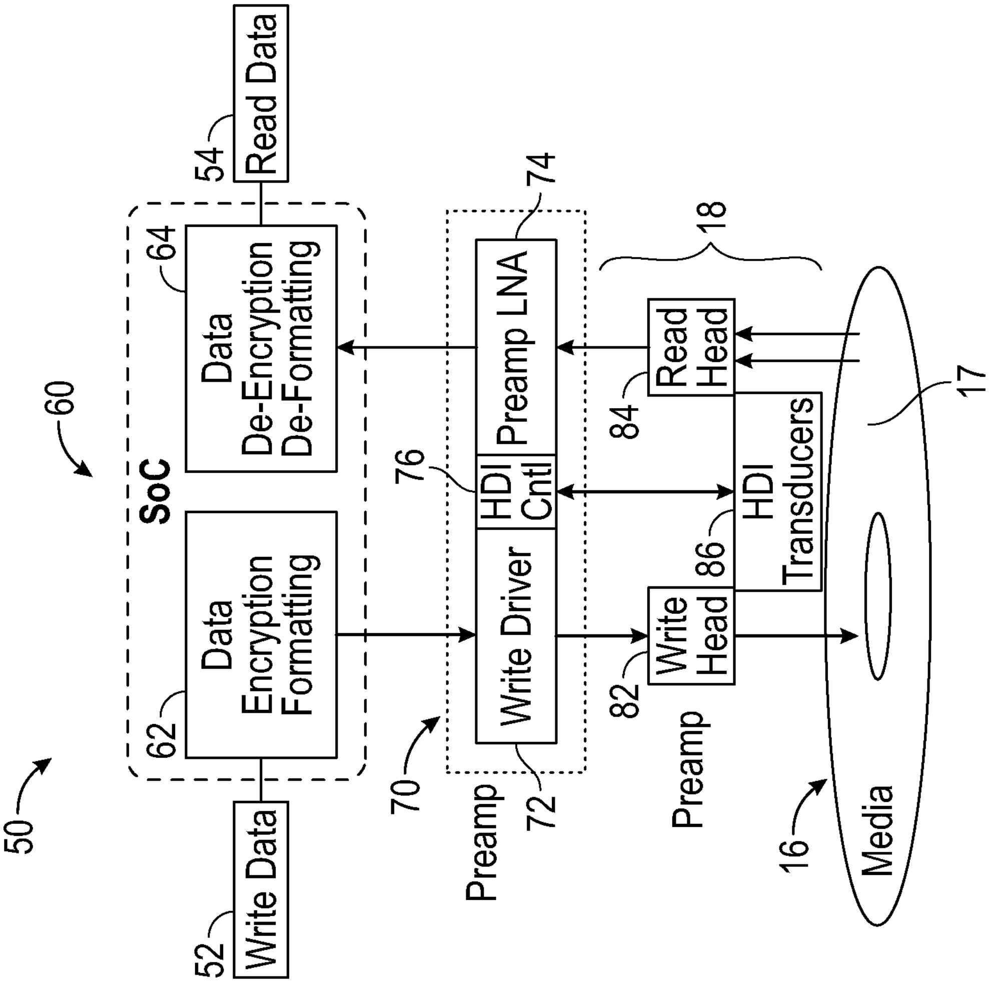
FIG. 2C is a block diagram conceptually illustrating an exemplary signal flow architecture of a data storage device in the form of an HDD, in accordance with aspects of this disclosure.

FIG. 2D is a flow diagram depicting a method 90 performed by control circuitry 22 for amplifying a differential read signal generated across a read transducer of a data storage device, in accordance with aspects of this disclosure.

In some examples, method 90 is performed by BIMAT amplifier 500, which is a component of control circuitry 22 and is depicted in FIGS. 10A-10D. With reference to FIGS. 2D and 10A-10D, in step 91, a differential read signal $V_{in}$ developed across read transducer resistance $R_{TMR}$ is applied across the bases of first (outer) BJT pair Q3 and Q4, which define the input nodes of the amplifier. In step 92, $V_{in}$ is amplified using a second (inner) BJT pair Q1 and Q2 having emitters that are coupled to the emitters of the first BJT pair Q3 and Q4. In step 93, a differential output signal $V_{out}$ is formed across cross-coupled collectors of the first and second BJT pairs (e.g., across the Q1-Q4 and Q2-Q3 collector nodes). In step 94, the differential output signal is fed back to the input nodes (bases of Q3 and Q4) through feedback resistors $R_F$ and emitter followers QE1 and QE2. Feedback resistors $R_F$ may be configured to tune the input impedance of the amplifier. In step 95, the differential bias voltage across $R_{TMR}$ is regulated based on the differential output signal. In step 96, the common-mode voltage at the input nodes is regulated based on a voltage $V_{cm}$ sensed at a center tap of a resistive divider $R_{CM1}$ and $R_{CM2}$ connected between the input nodes. The components and circuitry involved in carried out amplification method 90 will be described in more detail herein.

As track densities increase in magnetic storage systems, the physical dimensions of the read transducer are correspondingly reduced to match the narrower data tracks, which in turn reduces the effective cross-sectional area through which current flows. The resistance R of a read transducer is inversely proportional to its cross-sectional area, following the relation R=ρ·L/A, where ρ is the material resistivity, L is the length of the conduction path, and A is the area perpendicular to current flow. Thus, as the area A of the transducer decreases, the resistance of the transducer increases. In modern HDDs, the resulting increase in resistance may be substantial—200Ω-300Ω or even higher.

The elevated resistance of the read transducer presents challenges. As described above, the signal generated by the read transducer is conveyed to the amplifier via a transmission line. To minimize signal reflections and distortion, the impedance presented at both ends of the transmission line should closely match the characteristic impedance of the transmission line, which is typically around 50Ω. However, as resistances of modern read transducers may exceed transmission line impedance by a wide margin, impedance matching at the source (i.e., the transducer) may be impractical. Instead, impedance matching must be achieved at the receiver end, i.e., at the input of the amplifier.

Figure 3:
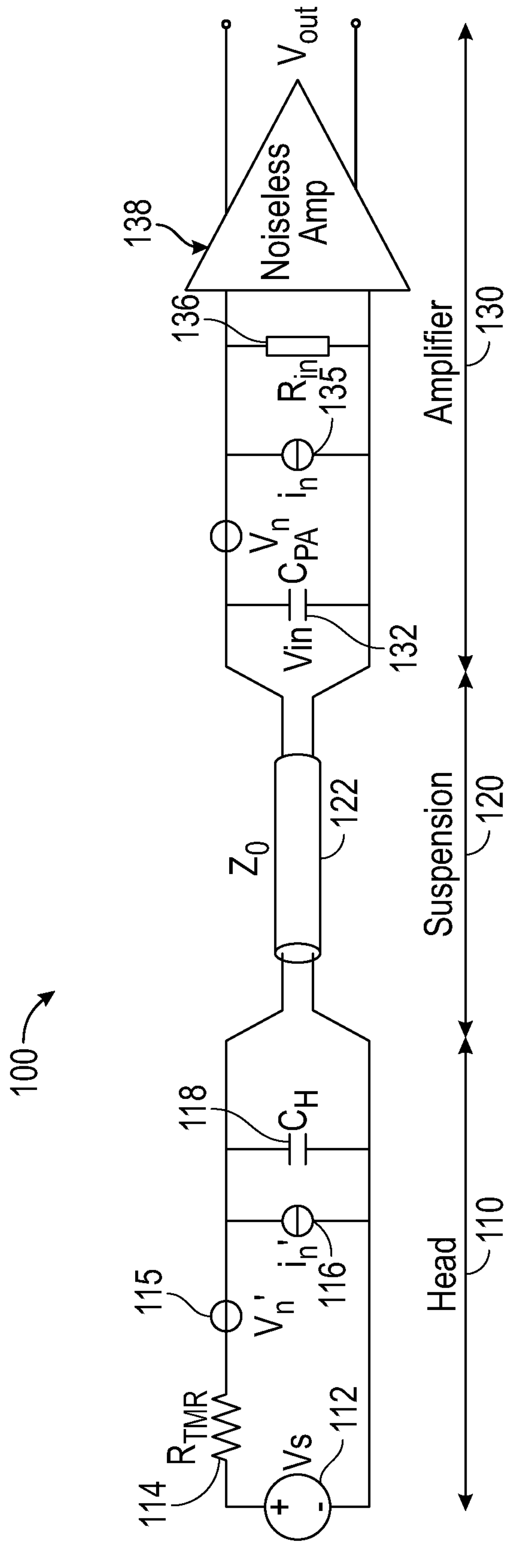
FIG. 3 is a circuit diagram illustrating a simplified model of a read signal path, in accordance with aspects of this disclosure.

To better illustrate these issues, FIG. 3 is a circuit diagram illustrating a simplified model of a read signal path 100, in accordance with aspects of this disclosure. FIG. 3 represents, in simplified form, the key components of read signal path 100: recording head 110; suspension 120; and amplifier 130. These components are configured in like fashion as the corresponding elements described in FIGS. 2A-2C. Recording head 110 comprises read transducer 114, which is modeled in FIG. 3 as a TMR element having resistance $R_{TMR}$. Read transducer 114 detects transitions in the direction of magnetization in the magnetized bits of disk surface 17, which correspond to transitions between binary one and zero states, through changes in its resistance $R_{TMR}$. Voltage source 112 is configured to apply bias voltage Vs across read transducer 114 to establish a bias current through read transducer 114, such that changes in resistance $R_{TMR}$ caused by magnetic bit transitions modulate the voltage across read transducer 114, resulting in a small AC signal superimposed on the applied DC bias voltage.

Noise sources associated with head 110 are modeled as voltage noise source 115 ($v_n'$) and current noise source 116 ($i_n'$). Noise sources 115 and 116 represent intrinsic electrical noise contributions such as thermal noise, which may arise from random electron motion due to temperature, and flicker noise, which may arise from material imperfections and device irregularities. Media noise, such as noise originating from irregularities in recorded magnetic transitions on disk surfaces 17, may also contribute to the total noise. A parasitic capacitance CH is also present and is modeled as capacitive element 118.

Suspension 120 includes transmission line 122 configured to convey the voltage differential developed across read transducer 114 to amplifier 130. Transmission line 122 has characteristic impedance $Z_0$, which is a fixed property determined by the geometry, spacing, and dielectric properties of conductors within line 122, as well as by the physical length l of line 122. When proper impedance matching is achieved between transmission line 122 and the input of amplifier 130, the signal transfer exhibits a substantially flat frequency response, with minimal amplitude attenuation or phase distortion.

Amplifier 130 is a component of control circuitry 22 and, with reference to FIG. 2C, may be implemented as part of low noise amplifier (LNA) stage 74 of preamplifier 70. Amplifier 130 receives input signal $V_{in}$ from head 110 via transmission line 122, where $V_{in}$ is the differential voltage across $R_{TMR}$. Amplifier 130 amplifies $V_{in}$ using a modeled noiseless amplifier 138 to generate an amplified output signal $V_{out}$. Amplifier 138 is modeled as noiseless in FIG. 3 to isolate and attribute noise contributions to the upstream components of the signal path, such as read transducer 114, transmission line 122, and the input stage of amplifier 138. A parasitic input capacitance $C_{PA}$ associated with amplifier 130 and modeled as input capacitor 132 represents the capacitive loading presented by the amplifier's input stage. Noise sources associated with the amplifier input are modeled as input-referred voltage noise source 134 ($v_n$) and input-referred current noise source 135 ($i_n$). These noise sources model non-ideal behavior of amplifier 130, including intrinsic device noise, thermal noise from internal resistances, and current noise from bias currents or input transistors.

Amplifier 130 has input impedance $R_{in}$ modeled as impedance component 136 configured in parallel with the differential input terminals to noiseless amplifier 138. $R_{in}$ is a key parameter in achieving impedance matching between amplifier 130 and transmission line 122. The impedance behavior of the transmission path including read transducer 114 and transmission line 122 is represented mathematically by the effective transmission line impedance $Z_{TL}$, which may be expressed as:

$$Z_{TL} = Z_0 \frac{R_{TMR} + Z_0 j\tan\beta l}{Z_0 + R_{TMR} j\tan\beta l}$$

where $Z_0$ is the characteristic impedance of transmission line 122, $R_{TMR}$ is the resistance of read transducer 114, j is the imaginary unit, β is the phase constant of transmission line 122 (β=2π/λ), and l is the physical length of transmission line 122. Thus, the effective impedance $Z_{TL}$ varies with sensor resistance, characteristic line impedance, signal frequency, and physical length.

At the input to amplifier 130, the parasitic capacitance $C_{PA}$ and input impedance $R_{in}$ primarily determine the loading characteristics of amplifier 130. To minimize reflections and preserve signal fidelity, $R_{in}$ should be approximately equal to $Z_0$. Noise sources $v_n$ and $i_n$ contribute additional signal degradation, compounding the noise already introduced by head 110 ($v_n'$ and $i_n'$). The total electronic low-frequency noise $$\overline{V_{out}^2}$$

observed at the output of amplifier 130 may be given by:

$$\overline{V_{out}^2} = A^2\left(\overline{v_n^2} + R_S^2\left(\overline{i_n^2} + \overline{i_{nb}^2}\right)\right)$$

where A is the gain of amplifier 130, $$\overline{v_n^2}$$

is the mean-square voltage noise of the amplifier input (voltage noise source 134), $R_S$ is the source resistance, corresponding here to $$R_{TMR}, \overline{i_n^2}$$

is the mean-square current noise of the amplifier input (current noise source 135), and $$\overline{i_{nb}^2}$$

is the mean-square current noise from the bias circuit. Thus, the total noise at the amplifier output depends both on voltage noise and current noise contributions. As $R_{TMR}$ increases, the contribution of current noise to the overall noise becomes more significant and degrades the signal-to-noise ratio (SNR).

The relationship between the characteristic impedance $Z_0$ of transmission line 122 and the input impedance $R_{in}$ of amplifier 130 influences how effectively the signal read by transducer 114 is transferred to amplifier 130. This is especially important when the length l of transmission line 122 is about one-quarter of the signal wavelength (λ/4) at the operating frequency. Under this condition, an impedance mismatch at one end of the line gets reflected and exaggerated at the other end. For example, if amplifier 130 presents a much lower impedance than transmission line 122 ($R_{in} << Z_0$), part of the signal reflects back toward head 110. These reflections can build up at λ/4, distorting the signal and causing peaking, which may complicate equalization of the signal by SoC 60. On the other hand, if the amplifier input impedance is too high ($R_{in} >> Z_0$), higher-frequency parts of the signal may be reflected or attenuated, causing the system to act like a low-pass filter that reduces bandwidth. The best case is when $R_{in}=Z_0$, creating a matched condition where the signal travels cleanly into the amplifier without reflections. Under matched conditions, the system bandwidth is determined primarily by intrinsic transmission line losses and the parasitic input capacitance $C_{PA}$ of amplifier 130.

The relationship between the read transducer resistance $R_{TMR}$ and the characteristic impedance $Z_0$ of transmission line 122 has a significant impact on noise behavior. When the read transducer resistance is much less than the characteristic impedance ($R_{TMR} << Z_0$), at λ/4, the effective transmission line impedance is $Z_{TL} \approx jZ_0\beta l \approx j\omega L_{eff}$, indicating inductive behavior. This can amplify thermal noise at high frequencies, causing peaks in the noise spectrum and making signal equalization more difficult. Conversely, when the read transducer resistance is much greater than the characteristic impedance ($R_{TMR} >> Z_0$), at λ/4, the effective transmission line impedance is $$Z_{TL} \approx \frac{Z_0}{j\beta l} \approx \frac{1}{j\omega C_{eff}},$$

indicating capacitive behavior. Here, high-frequency noise may be attenuated, which can sometimes improve SNR. However, if the capacitive effect is too strong, it may filter out parts of the signal and reduce the effective bandwidth. The best performance occurs when $R_{TMR}=Z_0$, minimizing these reactive effects and providing the best balance of clean signal transfer and low noise.

The preceding discussion illustrates the difficulties in capturing and amplifying readback signals from magnetic storage media-difficulties that are magnified as read transducer resistance increases and transmission line effects become more pronounced. These challenges demand amplifier designs that not only preserve signal integrity through careful impedance and noise management, but that can also be efficiently integrated into modern fabrication platforms. Compatibility with BiCMOS processes, which are commonly used in preamplifier ICs and enable the combination of high-performance bipolar transistors and low-power CMOS logic on a single chip, is essential. The following sections of this description describe a series of BiCMOS amplifier configurations, each taking a different approach to impedance matching and noise suppression, culminating in BIMAT amplifier 500 of FIG. 10A. The amplifiers described below may be configured, for example, within LNA 74 of preamplifier 70 (FIG. 2C), to amplify readback signals sensed from disk surface 17 by a read transducer such as transducer 114 having resistance $R_{TMR}$ (FIG. 3) and implemented as part of HDI transducers 86 within recording head 18.

Common Base (CB) Amplifier

Figure 4A:
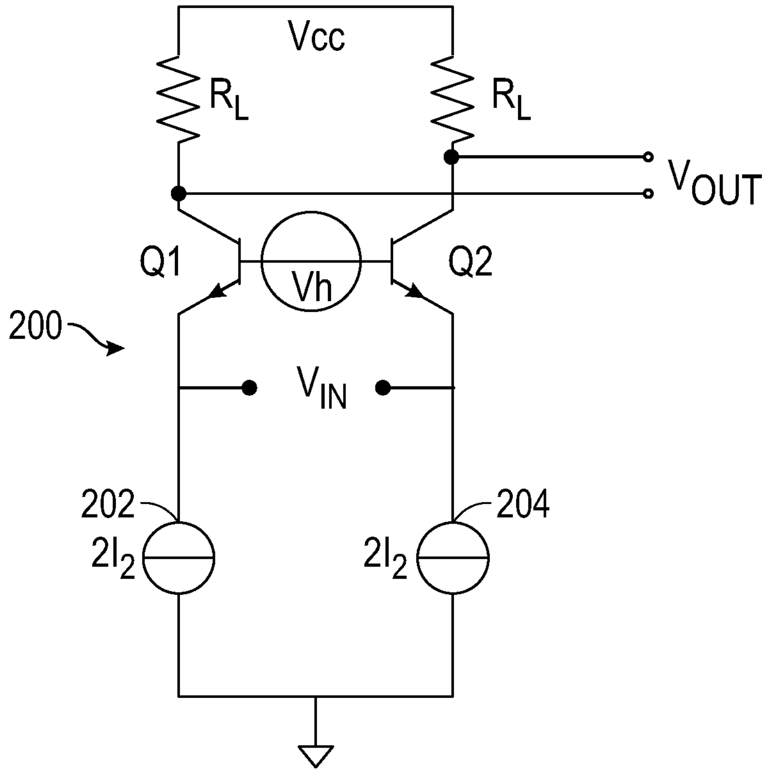
FIG. 4A is a circuit diagram of an amplifier configured with a common base (CB) topology to amplify a differential input signal generated by a read transducer, in accordance with aspects of this disclosure.

FIG. 4A is a circuit diagram of an amplifier 200 configured with a common base (CB) topology to amplify a differential input signal $V_{IN}$ generated by a read transducer, in accordance with aspects of this disclosure. In a CB amplifier, the input signal is applied to the transistor emitter, the output is taken from the collector, and the base is held at a fixed voltage to help achieve low input impedance and fast signal response. In FIG. 4A, the differential input signal $V_{IN}$ corresponds to the voltage drop developed across resistance $R_{TMR}$ of read transducer 114 as a result of applying bias voltage across transducer 114 during magnetic bit detection. This voltage $V_{IN}$ serves as the signal input to CB amplifier 200 and inherently includes the previously-discussed noise components of head 110 and effects of transmission line 122.

CB amplifier 200 comprises bipolar junction transistors (BJTs) Q1 and Q2 configured in a differential, common base configuration. In this configuration, CB amplifier 200 responds to the difference between two input voltages, rather than their absolute values. The differential input signal $V_{IN}$ is applied between the emitters of Q1 and Q2, and the bases of Q1 and Q2 are biased at a bias voltage Vb. The collectors of Q1 and Q2 are each connected to a load resistor $R_L$ and to a positive supply voltage $V_{cc}$, with the resulting collector voltages forming the differential output signal $V_{OUT}$. Bias current source 202 coupled to the emitter of Q1 and bias current source 204 coupled to the emitter of Q2 establish the quiescent operating point of Q1 and Q2. In some examples, bias current sources 202 and 204 operate each transistor at a collector current of approximately $2I_2$. The differential arrangement of CB amplifier 200 causes the output collector voltages to be in proportion to the differential signal applied to the emitters.

The fixed base potential of amplifier 200 establishes a low input impedance at the emitters, a defining characteristic of common base topology. In particular, the small-signal input resistance looking into each emitter of Q1 and Q2 is approximately $$r_e = \frac{1}{g_m} = \frac{V_T}{I_C},$$

where $g_m$ is the transistor transconductance, $$V_T = \frac{kT}{q}$$

is the thermal voltage (approximately 26 mV at room temperature), k is Boltzmann's constant (approximately $1.38\times10^{-23}$ J/K), T is the absolute temperature in kelvin, q is the elemental charge (approximately $1.6\times10^{-19}$ C), and $I_C$ is the collector current. As both Q1 and Q2 participate in handling the differential input, the total differential input impedance is approximately $R_{in}=2r_e$.

Noise performance is an important design consideration in CB amplifier 200. The total input-referred voltage noise is given by:

$$\overline{v_{vt}^2} = 4kT\Delta f\left(2r_b + \frac{1}{g_m}\right) = 4kT\Delta f(2r_b + r_e),$$

where $$\overline{v_{vt}^2}$$

is the mean square input-referred voltage noise, k is Boltzmann's constant, T is the absolute temperature, Δf is the bandwidth over which noise is measured, $r_b$ is the base spreading resistance of the transistor, $r_e$ is the small-signal intrinsic emitter resistance, and $g_m$ is the transconductance $$\left(g_m = \frac{1}{r_e} = \frac{I_C}{V_T}\right).$$

As can be seen, increasing the transconductance $g_m$ reduces the $$\frac{1}{g_m}$$

term, thereby lowering the total voltage noise. As $$g_m = \frac{I_C}{V_T},$$

transconductance can be increased (and voltage noise decreased) by increasing the collector current $I_C$. However, because the input impedance $$R_{in} = 2r_e = \frac{2V_T}{I_C},$$

increasing the collector current $I_C$ comes at the cost of reducing the input impedance $R_{in}$, which as described above distorts the signal and phase response. Thus, use of a common base amplifier such as CB amplifier 200 involves an inherent conflict between noise reduction and impedance matching in that the voltage noise $$\overline{v_{vt}^2}$$

cannot be decoupled from the input impedance $R_{in}$.

In addition to voltage noise, CB amplifier 200 contributes current noise, which can be expressed as follows:

$$\overline{v_{dt}^2} = R_{TMR}^2 q\Delta f\left(I_B + \frac{I_C}{\beta_\omega^2}\right),$$

where $$\overline{v_{dt}^2}$$

is the mean squared current noise converted to voltage noise across the read transducer resistance, $R_{TMR}$ is the resistance of read transducer 114, q is the elemental charge, Δf is the bandwidth over which noise is measured, $I_B$ is the base current, $I_C$ is the collector current, and $\beta_\omega$ is the transistor current gain at the operating frequency. Thus, current noise becomes more significant as $R_{TMR}$ increases, which is a continuing trend as areal density continues to improve. Though typically a secondary contributor compared to voltage noise, current noise can nonetheless impact the total noise floor.

Figure 4B:
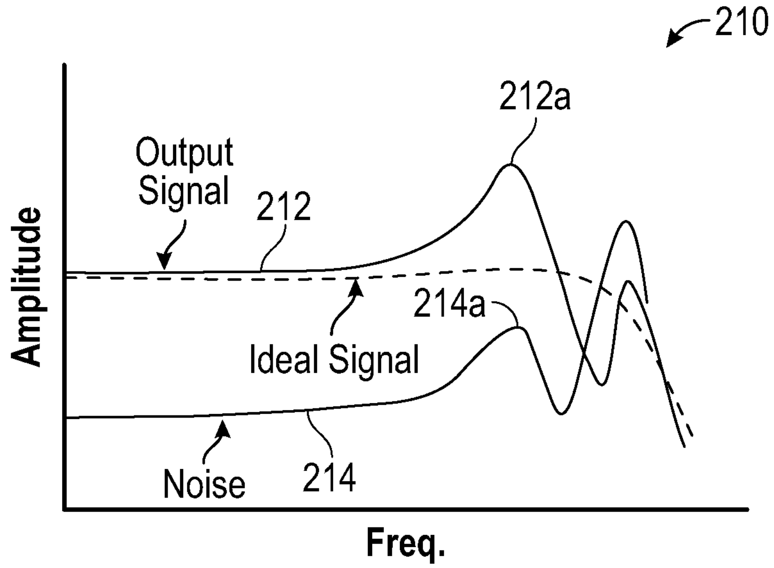
FIG. 4B is an exemplary graph plotting the signal transfer and noise frequency response of the amplifier of FIG. 4A, in accordance with aspects of this disclosure.

The impedance mismatch between amplifier 200 and read transducer 114 gives rise to transmission line resonance effects. FIG. 4B is an exemplary graph 210 plotting the signal transfer and noise frequency response of CB amplifier 200. As can be seen in FIG. 4B, signal transfer curve (output signal) 212 exhibits a distinct peak 212*a* at a point corresponding to a quarter-wavelength resonance condition $$\frac{1}{4}D,$$

where D represents the effective electrical length of transmission line 122. This $$\frac{1}{4}D$$

point is analogous to $$\frac{\lambda}{4}$$

resonance, where reflections and standing waves constructively interfere to create a gain increase. Amplitude peaking occurs in noise signal 214 as well as output signal 212, as reflected at peak 214*a* of noise signal 214, which also occurs at the $$\frac{1}{4}D$$

point. In addition to amplitude peaking, impedance mismatch between amplifier 200 and read transducer 114 introduces frequency-dependent phase distortion—the timing of different frequency components shifts unevenly, which distorts the shape of the signal and further complicates signal integrity.

The differential output signal $V_{OUT}$ of amplifier 200 is routed to additional components of control circuitry 22 for further signal processing. In some examples, the differential output signal $V_{OUT}$ is routed to a system-on-chip (SOC), such as SoC 60 of FIG. 2C, that performs digital equalization and other signal conditioning to correct amplitude and phase distortions from the analog front end. The resonance-induced peaking and phase distortion introduced by CB amplifier 200 reduces the equalizer's effectiveness and increases read errors.

Common Base Cross-Coupled (CB–CC) Amplifier

Figure 5:
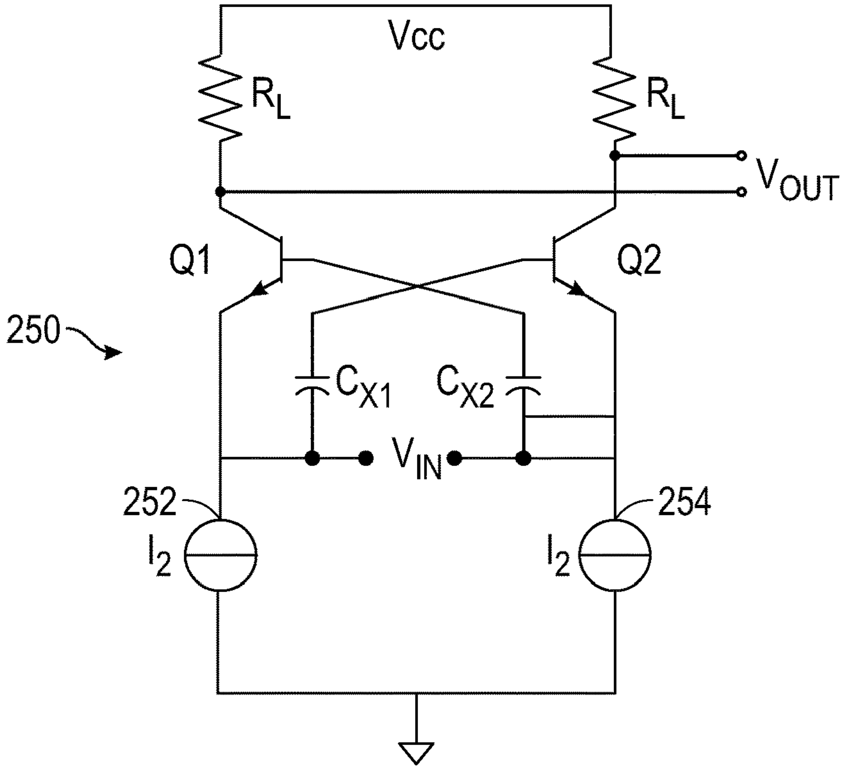
FIG. 5 is a circuit diagram of an amplifier configured with a common base cross-coupled (CB−CC) topology to amplify a differential input signal generated by a read transducer, in accordance with aspects of this disclosure.

FIG. 5 is a circuit diagram of an amplifier 250 configured with a common base cross-coupled (CB–CC) topology to amplify a differential input signal $V_{IN}$ generated by a read transducer, in accordance with aspects of this disclosure. CB–CC amplifier 250 is a refinement of CB amplifier 200 of FIG. 4A, implementing a cross-coupled topology designed to further reduce voltage noise. As with CB amplifier 200, the differential input signal $V_{IN}$ corresponds to the voltage drop across resistance $R_{TMR}$ of read transducer 114 as a result of applying bias voltage across transducer 114 during magnetic bit detection, and inherently includes head noise and transmission line effects.

CB–CC amplifier 250 comprises BJTs Q1 and Q2 configured in a differential, common base configuration. The differential input (read) signal $V_{IN}$ is applied between the emitters of Q1 and Q2. The collectors of Q1 and Q2 are each connected to a load resistor $R_L$ and to a positive supply voltage $V_{cc}$, with the resulting collector voltages forming the differential output signal $V_{OUT}$. The emitters of Q1 and Q2 are also connected to bias current sources 252 and 254, each of which sinks a constant bias current $I_2$ to establish the quiescent operating point of the transistors. Although not explicitly shown in FIG. 5, each transistor base is held at a bias voltage to forward bias the base-emitter junction. A distinguishing feature of amplifier 250 is the use of capacitive cross-coupling between the base of one transistor and the emitter of the opposite transistor. Specifically, capacitor $C_{X1}$ connects the emitter of Q1 to the base of Q2, and capacitor $C_{X2}$ connects the emitter of Q2 to the base of Q1. These capacitors pass only high-frequency signals, allowing AC feedback while preserving DC operating points.

CB–CC amplifier 250 amplifies the voltage difference between the emitters of Q1 and Q2. When the differential input signal $V_{IN}$ causes the emitter of Q1 to rise and the emitter of Q2 to fall, capacitor $C_{X1}$ conveys that rising signal to the base of Q2. Since the base of Q2 is rising while its emitter is falling, the base-emitter voltage of Q2 increases, thereby increasing the collector current of Q2. Simultaneously, capacitor $C_{X2}$ conveys the falling emitter signal of Q2 to the base of Q1. Since the base of Q1 is falling while its emitter is rising, the base-emitter voltage of Q1 decreases, reducing its collector current. This regenerative AC feedback reinforces the differential signal: the transistor conducting more becomes even more conductive, while the less-conductive one further shuts off. Because capacitors $C_{X1}$ and $C_{X2}$ block DC, the base-emitter cross-couplings do not interfere with the base biasing of the transistors.

The cross-coupled configuration of CB–CC amplifier 250 reduces input-referred voltage noise compared to the common base topology of CB amplifier 200. Voltage noise in this configuration is governed by the expression:

$$\overline{v_{vt}^2} = 4kT\Delta f\left(\frac{r_b}{2} + \frac{r_e}{4}\right),$$

where $$\overline{v_{vt}^2}$$

is the mean square input-referred voltage noise, k is Boltzmann's constant, T is the absolute temperature, Δf is the bandwidth over which noise is measured, $r_b$ is the base spreading resistance of the transistor, and $r_e$ is the small-signal intrinsic emitter resistance. In comparison to amplifier 200, the capacitive cross-coupling via $C_{X1}$ and $C_{X2}$ in amplifier 250 reduces the contribution of both the base resistance $r_b$ and the emitter resistance re to the voltage noise. However, this benefit comes with the tradeoff of further reducing the input impedance, which is given by $R_{in}=r_e$. Because of the cross-coupled feedback, the transistors of amplifier 250 act less independently, which alters their input resistance behavior. Instead of each transistor resisting with its own $r_e$, as in CB amplifier 200, the feedback effectively merges the transistors such that amplifier 250 acts like a single unit with just one re of resistance. As a result, CB–CC amplifier 250 intensifies the impedance mismatch with read transducer 114, which typically has a much higher resistance. This mismatch leads to even greater reflections, signal peaking, and phase distortion. As with CB amplifier 200, CB–CC amplifier 250 does not decouple voltage noise from input impedance.

Current noise in CB–CC amplifier 250 is governed by a similar relationship as in CB amplifier 200:

$$\overline{v_{dt}^2} = 4R_{TMR}^2 q\Delta f\left(I_B + \frac{I_C}{\beta_\omega^2}\right),$$

where $$\overline{v_{dt}^2}$$

is the mean squared current noise converted to voltage noise across the read transducer resistance, $R_{TMR}$ is the resistance of read transducer 114, q is the elemental charge, Δf is the bandwidth over which noise is measured, $I_B$ is the base current, $I_C$ is the collector current, and $\beta_\omega$ is the transistor current gain at the operating frequency. Thus, while the cross-coupling primarily targets voltage noise, current noise remains a significant factor as well, especially as $R_{TMR}$ continues to increase in modern read heads.

Common Emitter (CE) Amplifier

Figure 6:
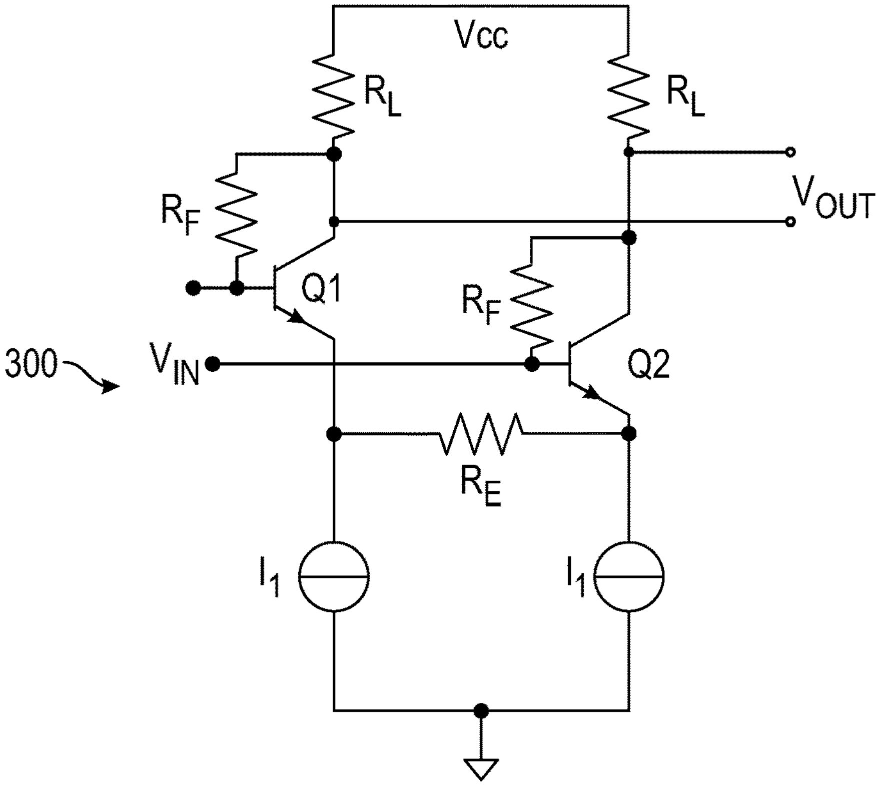
FIG. 6 is a circuit diagram of an amplifier configured with a common emitter (CE) topology to amplify a differential input signal generated by a read transducer, in accordance with aspects of this disclosure.

FIG. 6 is a circuit diagram of an amplifier 300 configured with a common emitter (CE) topology to amplify a differential input signal $V_{IN}$ generated by a read transducer, in accordance with aspects of this disclosure. In a CE configuration, the input signal is applied to the base, the output is taken from the collector, and the emitter serves as a shared reference point, allowing for higher voltage gain and higher input impedance as compared to CB configurations. Thus, CE amplifier 300 provides higher input impedance, addressing one of the key limitations of the common base configurations of FIGS. 4 and 5. However, as will be explained below, it does so at the cost of increased voltage noise.

As shown in FIG. 6, the differential input voltage $V_{IN}$ is developed across read transducer 114 (FIG. 3) and is applied across the bases of BJTs Q1 and Q2. Each of Q1 and Q2 has its collector connected to supply voltage $V_{cc}$ through a load resistor $R_L$, and its base connected to the collector via a feedback resistor $R_F$. Emitter resistor $R_E$ bridges the emitters of Q1 and Q2. Each emitter is also connected to a bias current source $I_1$ that sinks current to ground and ensures proper biasing of the transistors. CE amplifier 300 amplifies the difference between the input voltages at the bases of Q1 and Q2. When the base of Q1 rises relative to Q2, Q1 turns on more and conducts more current, and Q2 turns off slightly and conducts less. These changes in current produce opposing voltage changes at the collectors (via load resistors $R_L$), and the differential between collector voltages is taken as the output $V_{OUT}$.

Emitter resistor $R_E$ handles the DC bias offset introduced by read transducer 114. As previously described, transducer 114 must be biased at a fixed voltage to function properly, and this bias appears at the input to amplifier 300. However, Q1 and Q2 must operate symmetrically around a common reference. Emitter resistor $R_E$ provides a path that allows each emitter to "see" a balanced voltage relative to the other, offsetting the DC offset from transducer 114 and allowing the differential transistor pair to function properly. However, the presence of emitter resistor $R_E$ introduces thermal noise. All resistors at non-zero temperature produce random voltage fluctuations due to the thermal motion of electrons, and even small resistors can contribute significant noise. Because $R_E$ connects the emitters, this noise appears directly in the differential signal path and thus contributes to input-referred voltage noise, degrading the signal-to-noise ratio (SNR) of CE amplifier 300 relative to CB amplifier 200 and CB–CC amplifier 250.

CE amplifier 300 achieves higher input impedance than CB amplifiers 200 and 250 because the input signal is applied to the transistor bases rather than the emitters. In a common emitter configuration, the small-signal input impedance at the base is approximately $$r_\pi = \beta \cdot r_e = \beta \cdot \frac{V_T}{I_C},$$

where β is the transistor current gain, $V_T$ is the thermal voltage, and $I_C$ is the collector current. This input impedance is higher than the emitter-based input impedance of CB topologies, which is typically just $$r_e = \frac{V_T}{I_C},$$

enabling better impedance matching with modern read transducers having higher resistances.

In conventional CB topologies such as amplifiers 200 and 250, voltage noise and input impedance are tightly linked because both depend on transconductance: increasing $g_m$ to reduce voltage noise simultaneously reduces input impedance, creating a fundamental tradeoff. In CE amplifier 300, this coupling is mitigated through the use of feedback resistors $R_F$. Feedback resistors $R_F$ feed a portion of the output signal back to the input to regulate the base-emitter voltage, thereby moderating gain fluctuations and suppressing excess voltage noise. Because noise suppression is achieved via feedback rather than by increasing $g_m$, amplifier 300 is able to maintain its high base input impedance without directly impacting noise performance. However, additional thermal voltage noise is independently introduced by emitter resistor $R_E$.

Common Emitter+Common Base (CE+CB) Amplifier

Figure 7A:
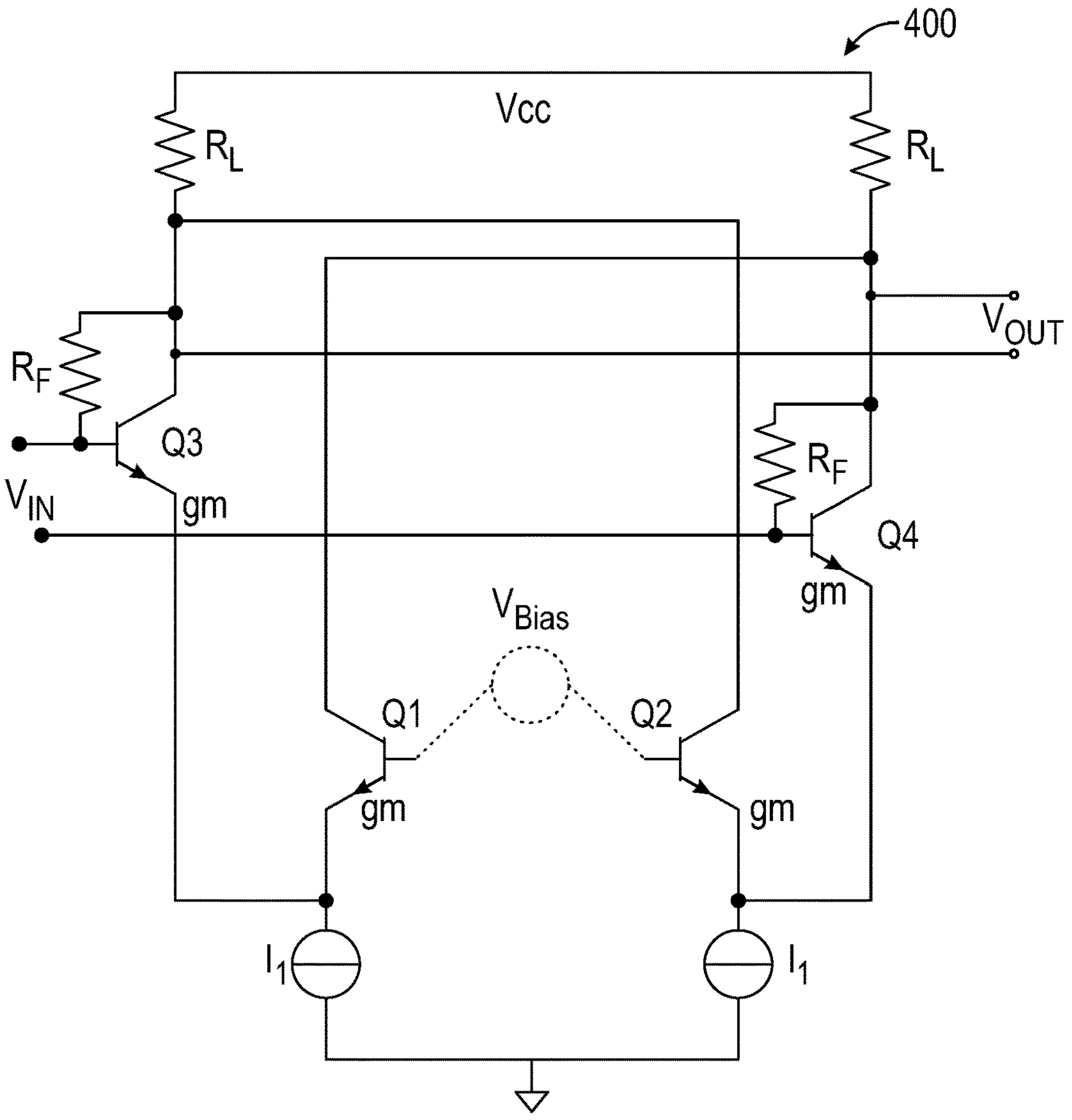
FIG. 7A is a circuit diagram of an amplifier configured with a common emitter-common base (CE+CB) topology to amplify a differential input signal generated by a read transducer, in accordance with aspects of this disclosure.

FIG. 7A is a circuit diagram of an amplifier 400 configured with a common emitter-common base (CE+CB) topology to amplify a differential input signal $V_{IN}$ generated by a read transducer, in accordance with aspects of this disclosure. Amplifier 400 combines the benefits of the CE and CB amplifier architectures described in FIGS. 4-6. While CB amplifier 200 offers low noise but low input impedance, and CE amplifier 300 provides higher input impedance at the cost of increased thermal noise, CE+CB amplifier 400 integrates features of both designs to provide a combination of noise performance and input impedance that neither the CE nor CB configuration can achieve on its own.

CE+CB amplifier 400 comprises inner BJT pair Q1-Q2 and outer BJT pair Q3-Q4. The signal from read transducer 114, which senses magnetic transitions from the disk and generates a differential read signal $V_{IN}$, is applied to the bases of outer transistor pair Q3-Q4. Because $V_{IN}$ enters at the base rather than the emitter, CE+CB amplifier 400 presents a high input impedance, which allows it to receive signals from read transducer 114 without excessive signal loss or distortion. The bases of Q1 and Q2 are held at a bias voltage $V_{Bias}$, which may be a "loose" bias voltage reference as described in more detail below. The emitters of Q3 and Q1 are tied together and connect to a first bias current source $I_1$ that controls how much current flows through that leg of the circuit. Similarly, Q4 and Q2 share an emitter path and a second bias current source $I_1$ on the other side. By this configuration, inner transistor pair Q1-Q2 and outer transistor pair Q3-Q4 both influence how current flows, but only outer transistor pair Q3-Q4 is coupled directly to the input signal $V_{IN}$.

The collectors of Q1 and Q4 are connected together, as are the collectors of Q2 and Q3. Collector nodes Q1-Q4 and Q2-Q3 serve as the differential outputs of amplifier 400 and are connected to supply voltage $V_{cc}$ through load resistors $R_L$, which convert current changes into voltage changes. Collector node Q2-Q3 also connects to a first feedback resistor $R_F$ that loops back to the base of Q3, and collector node Q1-Q4 connects to a second feedback resistor $R_F$ that loops back to the base of Q4. These feedback loops stabilize gain, reduce distortion, and allow amplifier 400 to maintain low voltage noise without having to lower the input impedance.

A key feature of CE+CB amplifier 400 is the cross-coupling of the collectors: Q1 shares a collector with Q4, and Q2 shares a collector with Q3. When Q3 amplifies a signal and increases current through its leg, for example, Q2 reacts by conducting less current. The collector node shared between Q2 and Q3 reflects the combined behavior, resulting in a stronger differential signal at the output. The Q1/Q4 pair behaves in similar fashion. This collector cross-coupling enhances the differential-mode gain, meaning amplifier 400 becomes more sensitive to small voltage changes. In some examples, amplifier 400 provides an additional 6 dB of signal gain, which improves the signal-to-noise ratio (SNR).

Inner transistor pair Q1-Q2 functions like a CB amplifier in that their bases are fixed to a bias voltage ($V_{Bias}$) and they do not receive the input signal directly. Instead, they respond to changes in emitter voltage caused by outer transistor pair Q3-Q4. Because they are tied into shared emitter paths (Q1-Q3 and Q2-Q4) and their collectors are cross-coupled with those of the opposite input transistor (Q1-Q4 and Q2-Q3), they play an active role in shaping the output signal. Unlike CE amplifier 300, which uses an emitter resistor $R_E$ to set the DC operating point and linearize the gain, CE+CB amplifier 400 applies a bias voltage $V_{Bias}$ between the bases of Q1 and Q2. Thus, the thermal noise contribution from emitter resistor $R_E$ is eliminated, and biasing is instead imposed on the input impedance.

The overall input impedance $R_{in}$ of amplifier 400 can be expressed as:

$$R_{in} = \frac{2(R_F + R_L)}{1 + g_m R_L + \frac{R_F + R_L}{r_\pi}}$$

Thus, the input impedance $R_{in}$ depends on feedback resistance $R_F$, load resistance $R_L$, transconductance $g_m$, and base resistance $r_\pi$. Unlike in CB designs, where increasing $g_m$ to reduce noise causes a corresponding drop in input impedance, here the feedback resistance $R_F$ moderates that relationship. By tuning $R_F$, one can maintain high input impedance while still pushing $g_m$ higher to reduce voltage noise.

The gain G of amplifier 400 is given as:

$$G = \frac{\frac{R_L}{R_F} - g_m R_L}{\frac{R_L}{R_F} + 1}$$

Thus, the amplifier gain is governed by the ratio of the load and feedback resistances, and by the transistor transconductance. Higher load resistance $R_L$ boosts gain, while higher feedback resistance $R_F$ reduces gain. Importantly, the gain can be set independently from noise or impedance considerations.

The full gain $G_T$ from transducer $R_{TMR}$ of amplifier 400 can be expressed as:

$$G_T = \frac{G R_{in}}{R_{in} + R_{TMR}}$$

As this expression shows, if $R_{in}$ is much greater than $R_{TMR}$, nearly the full gain G is preserved. But if $R_{in}$ is too low, a large portion of the input signal is lost to impedance mismatch. Because CE+CB amplifier 400 is able to maintain a relatively high and tunable $R_{in}$, it avoids this kind of signal loss and ensures that the read head output is transferred efficiently into amplifier 400.

$$\overline{v_{vt}^2}$$

The input-referred voltage noise of amplifier 400 is given by:

$$\overline{v_{vt}^2} = 4kT\Delta f\left(4r_b + \frac{2}{g_m}\right)$$

Thus, there are two main contributors to voltage noise in amplifier 400: the base resistance $r_b$ and the transconductance $g_m$. The presence of $$\frac{2}{g_m}$$

in the voltage noise expression shows that increasing $g_m$ (i.e., biasing the transistors to conduct more current) reduces voltage noise. In CB amplifier 200, this comes at the cost of lowering input impedance. In CE+CB amplifier 400, due to its feedback structure, increasing $g_m$ reduces noise without forcing a tradeoff with the input impedance $R_{in}$.

The current noise $$\overline{v_{dt}^2}$$

is given by:

$$\overline{v_{dt}^2} = R_{TMR}^2 q\Delta f\left(I_B + \frac{I_C}{\beta^2}\right)$$

This expression shows that current noise arises from noise associated with base current $I_B$ and collector current $I_C$, scaled by the square of the read transducer resistance $R_{TMR}$. Although the current noise contribution is generally smaller than voltage noise, it becomes more significant as the read transducer resistance increases.

In sum, CE+CB amplifier 400 combines the input impedance benefits of CE topology with the noise and gain efficiency of CB architecture, operating as two amplifiers in parallel. The input is received at the bases of the outer (first) CE pair Q3-Q4, which establishes a higher input impedance, while the inner (second) CB pair Q1-Q2 establishes emitter bias and enhances gain through cross-coupling. Feedback through resistors $R_F$ allows precise tuning of input impedance and gain, and allows for increased transconductance without an impedance loss penalty.

Figure 7B:
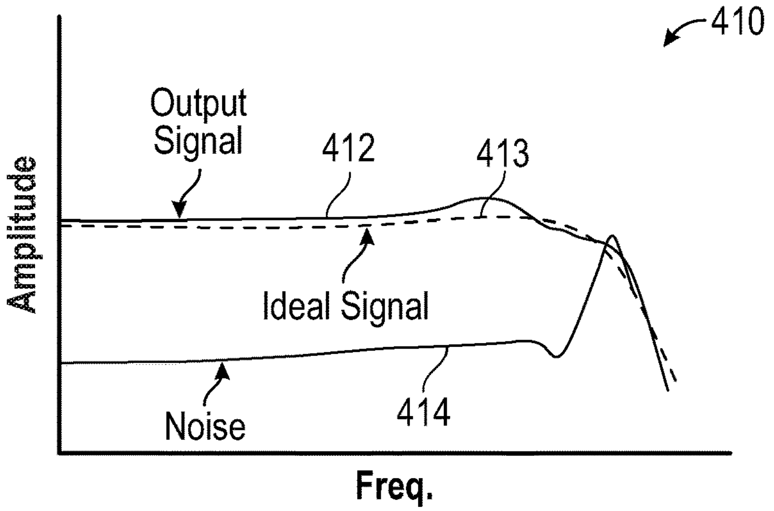
FIG. 7B is an exemplary graph plotting the signal transfer and noise frequency response of the amplifier of FIG. 7A, in accordance with aspects of this disclosure.

FIG. 7B is an exemplary graph 410 plotting the signal transfer and noise frequency response of CE+CB amplifier 400, in accordance with aspects of this disclosure. As can be seen in FIG. 7B, amplifier output signal 412 closely tracks the ideal signal output 413, without the sharp peaking seen in lower impedance amplifier designs (see, e.g. FIG. 4B). This confirms that the hybrid CE+CB architecture of amplifier 400 successfully suppresses resonance effects that previously caused signal distortion. Amplifier 400 also maintains low and stable input-referred noise signal 414, consistent with the noise equations discussed above.

CE+CB Cross-Coupled (CE+CB–CC) Amplifier

Figure 8:
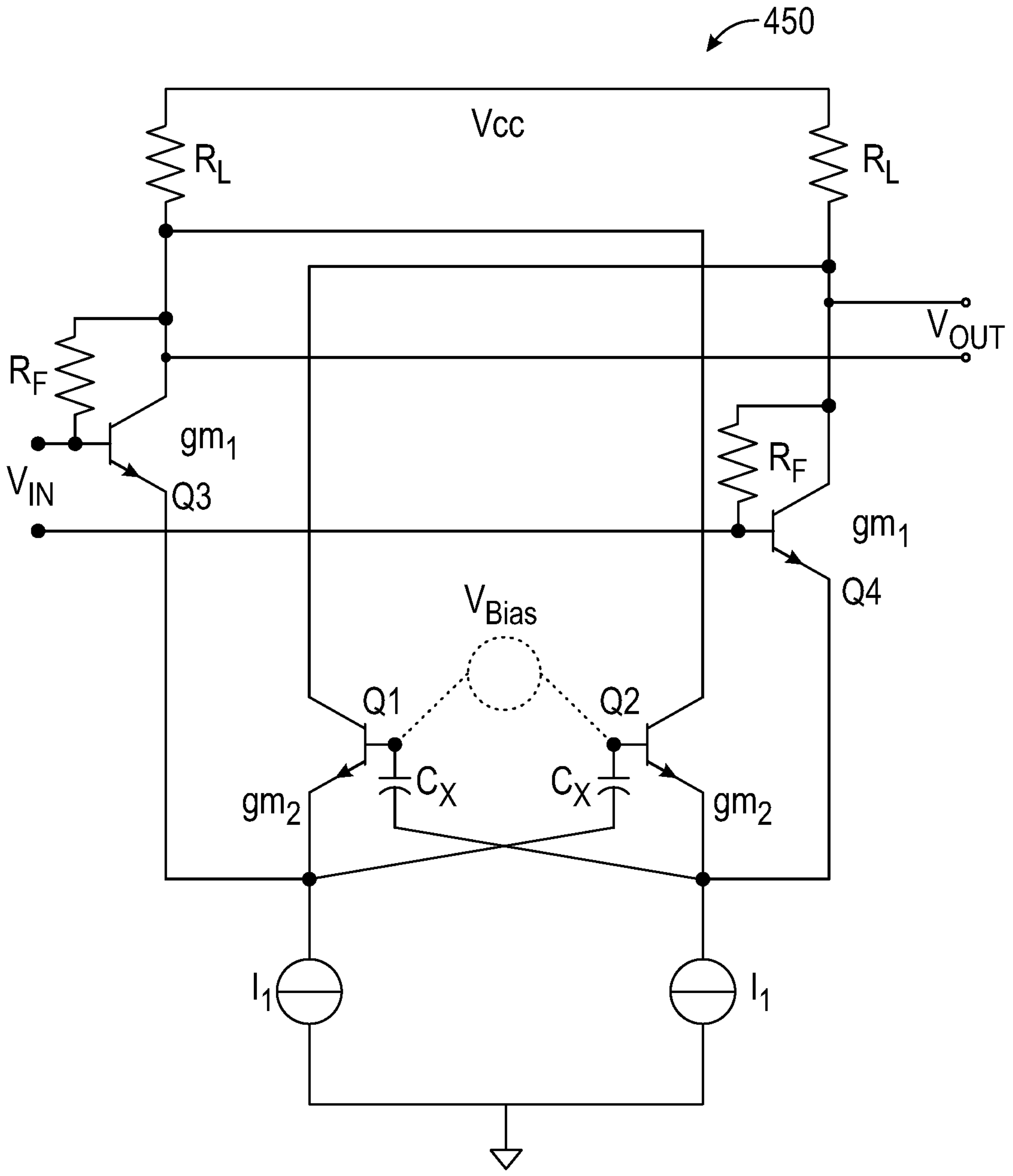
FIG. 8 is a circuit diagram of an amplifier configured with a common emitter, common base cross-coupled (CE+CB−CC) topology to amplify a differential input signal generated by a read transducer, in accordance with aspects of this disclosure.

FIG. 8 is a circuit diagram of an amplifier 450 configured with a common emitter, common base cross-coupled (CE+CB–CC) topology to amplify a differential input signal $V_{IN}$ generated by a read transducer, in accordance with aspects of this disclosure. CE+CB–CC amplifier 450 builds directly on the architecture of CE+CB amplifier 400 of FIG. 7A. The core topology remains the same: amplifier 450 comprises inner transistor pair Q1-Q2 and outer transistor pair Q3-Q4. Differential input (read) signal $V_{IN}$ is applied across the bases of outer transistor pair Q3-Q4, which operate in a common-emitter configuration and provide high input impedance. Q3 shares its emitter with Q1, and Q4 shares its emitter with Q2. The bases of Q1 and Q2 are held at a bias voltage $V_{Bias}$. Q1 and Q4 share collectors, as do Q2 and Q3. Collector nodes Q1-Q4 and Q2-Q3 serve as the differential outputs of amplifier 450 and are connected to supply voltage $V_{cc}$ through load resistors $R_L$. Feedback resistors $R_F$ connect the Q2-Q3 collector/output node to the base of Q3 and the Q1-Q4 collector/output node to the base of Q4, allowing fine-tuned control of gain and input impedance. Bias current sources $I_1$ set the bias current for each emitter pair.

The key difference in CE+CB–CC amplifier 450 relative to CE+CB amplifier 400 is the introduction of capacitive cross-coupling between inner transistors Q1 and Q2: capacitor $C_X$ connects the base of Q1 to the emitter of Q2, and an identical capacitor $C_X$ connects the base of Q2 to the emitter of Q1. This modification transforms the inner transistor pair into a double cross-coupled (DCC) structure, with collector cross-coupling retained from amplifier 400 and base-to-emitter capacitive cross-coupling added. This additional base-emitter coupling provides a cross-coupled common base (CB–CC) effect within inner transistor pair Q1-Q2. Specifically, when a signal at the emitter of one of inner transistors Q1 and Q2 changes due to current modulation in one of outer transistors Q3 and Q4, the resulting voltage fluctuation is AC-coupled into the base of the other of inner transistors Q1 and Q2. This produces a regenerative, signal-reinforcing effect, similar to that seen in CB–CC amplifier 250 of FIG. 5, but isolated to the inner transistor pair, which handles gain without directly sensing input signal $V_{IN}$. Voltage noise is reduced by the cross-coupling within CB inner pair Q1-Q2, while high input impedance is preserved since the input signal still enters through CE outer pair Q3-Q4.

In some examples, a modified biasing approach is employed for the inner bases (Q1 and Q2). Rather than applying a fixed, low-impedance DC bias, the bias voltage is supplied through a high-impedance path, such as a 5 kΩ resistor in series with the bias voltage source $V_{Bias}$. This establishes a loose DC reference at the base nodes that is sufficient to maintain the correct quiescent operating point but without tightly clamping the voltage. A low impedance bias connection would resist voltage movement at the base and suppress the small signal swings required for proper amplification. By using a bias resistor, as frequency increases, the cross-coupling capacitors $C_X$ present a much lower impedance than the bias resistor, effectively shorting around it for AC signals. This allows the base-emitter cross-coupling to dominate the AC response of amplifier 450 while the high impedance resistor continues to maintain the desired DC bias.

CE+CB–CC amplifier 450 provides high input impedance, in contrast to earlier low-impedance CB and CB–CC designs. The feedback path, set by $R_F$, controls $R_{in}$ and stabilizes gain, while the cross-coupling scheme enhances signal transfer and noise suppression. Noise, gain, and input impedance for amplifier 450 are governed by the following equations:

$$\overline{v_{ni}^2} = 4kT\Delta f\left(\frac{5r_b}{2} + \frac{5}{4g_m}\right)$$

$$\overline{v_{di}^2} = R_{TMR}^2 q\Delta f\left(I_B + \frac{I_C}{\beta^2}\right)$$

$$G = \frac{\frac{R_L}{R_F} - \frac{4}{3}g_m R_L}{\frac{R_L}{R_F} + 1}$$

$$R_{in} = \frac{2(R_F + R_L)}{1 + \frac{4}{3}g_m R_L + \frac{R_F + R_L}{r_\pi}}$$

These equations reflect the increased gain and reduced noise resulting from the DCC structure. Gain may be increased by approximately 6 dB, further improving SNR. The transconductance $g_m$ may be increased, such as by increasing bias current, with less penalty to $R_{in}$ than in the previous designs. The voltage noise $$(\overline{v_{ni}^2})$$

equation shows improved scaling of both base resistance and transconductance terms, allowing amplifier 450 to achieve lower input-referred voltage noise.

CE Emitter-Follower (EF)+CB–CC Amplifier

Figure 9:
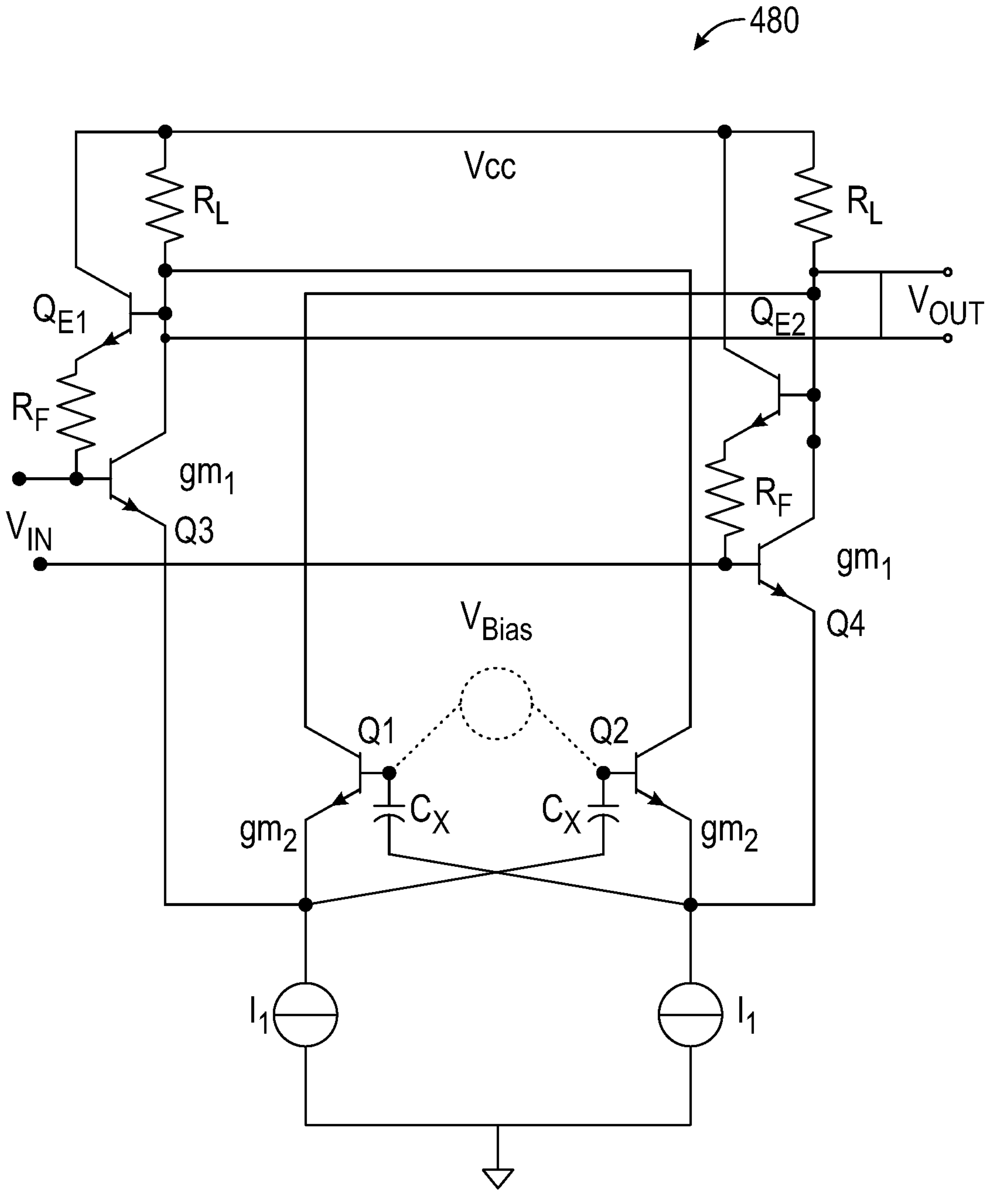
FIG. 9 is a circuit diagram of an amplifier configured with a common emitter, emitter-follower, common base, cross-coupled (CE−EF+CB−CC) topology to amplify a differential input signal generated by a read transducer, in accordance with aspects of this disclosure.

FIG. 9 is a circuit diagram of an amplifier 480 configured with a common emitter, emitter-follower, common base, cross-coupled (CE–EF+CB–CC) topology to amplify a differential input signal $V_{IN}$ generated by a read transducer, in accordance with aspects of this disclosure. Amplifier 480 builds on the CE+CB–CC architecture of amplifier 450 of FIG. 8 by adding emitter follower transistors QE1 and QE2 to the feedback paths. The core architecture remains the same as in FIG. 8, including differential input $V_{IN}$ applied across the bases of outer (first) BJT pair Q3 and Q4, cross-coupled inner BJT pair Q1 and Q2 (with both collector and capacitive base-emitter cross-coupling), bias current sources $I_1$ and load resistors $R_L$.

The key enhancement in amplifier 480 is the inclusion of emitter follower stages QE1 and QE2 between the output nodes and the bases of Q3 and Q4. An emitter follower is a transistor configuration in which the output is taken from the emitter, and the input is applied to the base. It provides voltage buffering with near-unity gain, meaning that the output voltage closely tracks the input voltage, but with much lower output impedance. This allows the emitter follower to drive resistive loads or subsequent stages without drawing significant current from the source. In effect, the emitter follower "copies" the voltage while isolating the load.

In amplifier 480, the base of QE1 is connected to the Q2-Q3 collector node (one $V_{OUT}$ output node), and its emitter is coupled through feedback resistor $R_F$ to the base of Q3 (one $V_{IN}$ input node). Similarly, the base of QE2 is connected to the Q1-Q4 collector node (the other $V_{OUT}$ output node), and its emitter is connected through another feedback resistor $R_F$ to the base of Q4 (the other $V_{IN}$ input node). The collectors of QE1 and QE2 are coupled to the supply voltage $V_{cc}$. By inserting QE1 and QE2 into the feedback paths, amplifier 480 decouples the amplifier input (bases of Q3, Q4) from the amplifier output and from the loading effects of load resistors $R_L$. Because emitter followers QE1 and QE2 replicate the amplifier output voltages (differential nodes of $V_{OUT}$) at their emitters, but with low impedance, they drive feedback resistors $R_F$ without drawing appreciable current from load resistors $R_L$. This results in lower distortion, better SNR, and more predictable gain. Additionally, emitter followers QE1 and QE2 provide signal isolation by buffering the output signal before it is applied to the feedback path. The high input impedance and low output impedance of QE1 and QE2 prevent downstream loading effects from influencing the base drive of Q3 and Q4.

Amplifier 480 provides high input impedance, enhanced signal-to-noise ratio, and strong, linear gain with minimal distortion or peaking. Decoupling the input from the output also simplifies the noise, gain, and input impedance equations, which are as follows:

$$\overline{v_{vi}^2} = 4kT\Delta f\left(\frac{5r_b}{2} + \frac{5}{4g_m}\right)$$

$$\overline{v_{di}^2} = R_{TMR}^2 q\Delta f\left(I_B + \frac{I_C}{\beta^2}\right)$$

$$G = \frac{4}{3}g_m R_L$$

$$R_{in} = \frac{2(R_F + R_L)}{1 + \frac{4}{3}g_m R_L + \frac{R_F + R_L}{r_\pi}}$$

These expressions show that the voltage noise $$\overline{v_{vi}^2}$$

of CE–EF+CB–CC amplifier 480 is comparable to that of CE+CB–CC amplifier 450. The gain G is simplified and depends linearly on transconductance $g_m$ and load resistance Rz, which are both tunable parameters, due to the added emitter follower buffering. The input impedance $R_{in}$ remains tunable through $R_F$ and is less sensitive to variations in $g_m$, such that the feedback circuit may be configured so that the input impedance of the amplifier substantially matches the impedance of the transmission line.

BiCMOS Impedance-Matched Amplifier with Transducer Bias (BIMAT)

Figure 10A:
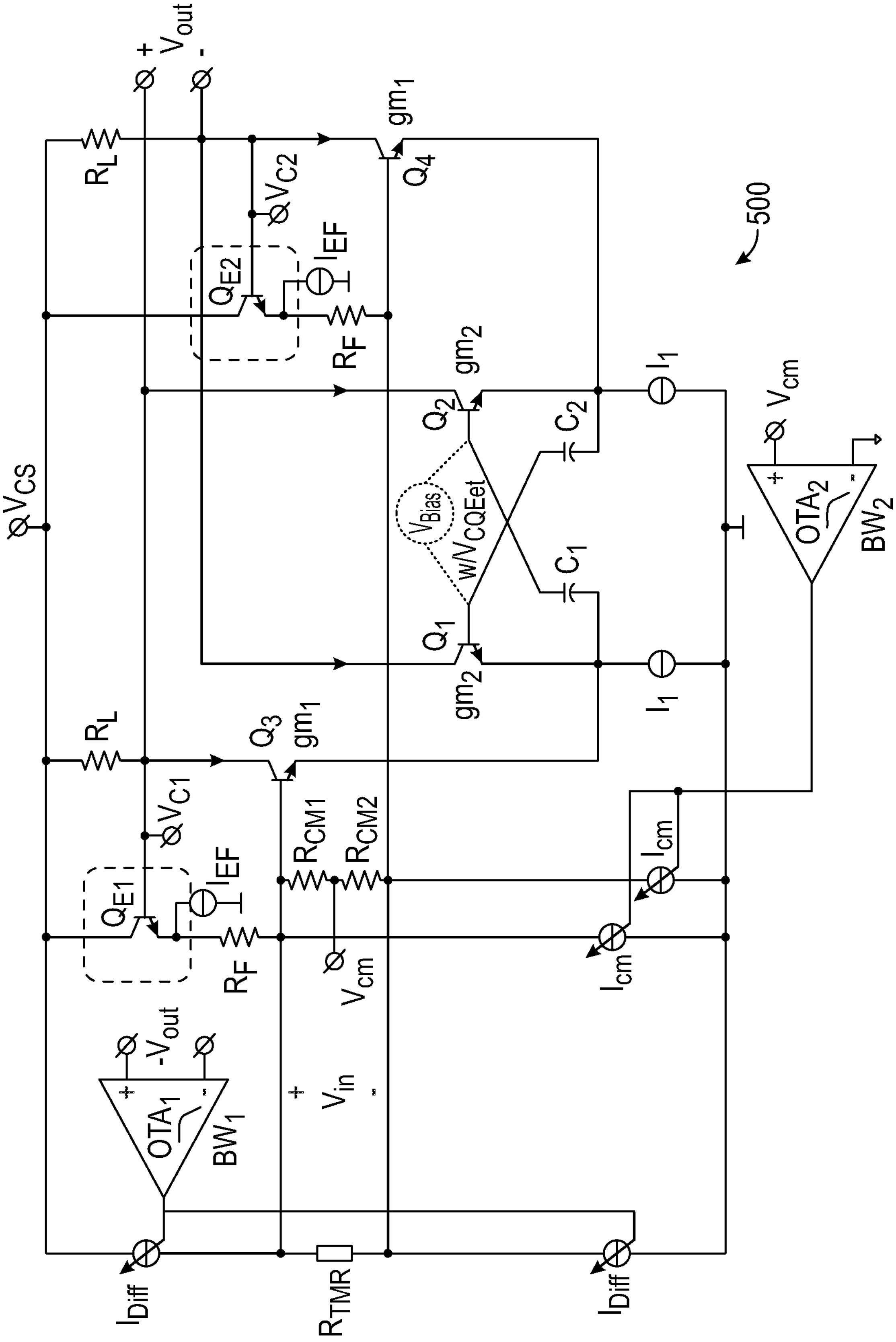
FIG. 10A is a circuit diagram of an amplifier configured with a BIMAT (BiCMOS Impedance-Matched Amplifier with Transducer bias) topology to amplify a differential input signal generated by a read transducer, in accordance with aspects of this disclosure.

FIG. 10A is a circuit diagram of an amplifier 500 configured with a BIMAT (BiCMOS Impedance-Matched Amplifier with Transducer bias) topology to amplify a differential input signal $V_{IN}$ generated by a read transducer, in accordance with aspects of this disclosure. BIMAT amplifier 500 represents a fully realized implementation of the CE–EF+CB–CC amplifier of FIG. 9. Amplifier 500 explicitly depicts the read transducer resistance $R_{TMR}$ in the amplifier signal path and incorporates a complete bias and feedback control scheme to facilitate stable operation. Amplifier 500 is fabricated using a BiCMOS process that combines the low-noise, high-speed performance of bipolar junction transistors (BJTs) in the analog signal path with the flexible biasing and low-power integration characteristics of CMOS-based circuitry. Although the transmission line connecting $R_{TMR}$ to amplifier 500 is not explicitly shown, it is typically implemented along the suspension and introduces impedance-matching considerations, such as quarter-wavelength resonance effects, signal reflections, and bandwidth limitations (see, e.g., the description of transmission line 122 with reference to FIG. 3). BIMAT amplifier 500 is configured to address these concerns consistent with the noise, impedance, and gain characteristics described for amplifier 480 of FIG. 9, and as further described below.

The primary topology of BIMAT amplifier 500 is consistent with that of CE–EF+CB–CC amplifier 480 of FIG. 9. Amplifier 500 includes an outer (first) differential pair formed by bipolar junction transistors Q3 and Q4, and an inner (second) differential pair formed by bipolar junction transistors Q1 and Q2. The emitters of Q1 and Q3 are shared and biased by bias current source $I_1$. Similarly, the emitters of Q2 and Q4 are shared and biased by another instance of bias current source $I_1$, establishing symmetric current branches. The collectors of Q1 and Q4 are connected to form one output node of the differential output signal $V_{OUT}$, and the collectors of Q2 and Q3 are likewise connected to form the complementary output node. Each output node is connected to supply voltage $V_{CS}$ through a respective load resistor $R_L$.

Feedback resistors $R_F$ are connected between the Q1-Q4 collector node and the base of Q4, and between the Q2-Q3 collector node and the base of Q3. Feedback resistors $R_F$ are driven by emitter followers QE1 and QE2. QE1 buffers the Q2-Q3 collector node and drives the feedback resistor $R_F$ connected to the base of Q3. Similarly, QE2 buffers the Q1-Q4 collector node and drives the feedback resistor $R_F$ connected to the base of Q4. The feedback resistors and emitter followers may be collectively referred to as a feedback circuit. Emitter followers QE1 and QE2 isolate the amplifier output nodes and load resistors from the feedback circuit and provide low impedance drive to the outer differential pair Q3 and Q4. In some examples, QE1 and QE2 are each biased by a respective current source $I_{EF}$ connected between its emitter and ground. Current sources $I_{EF}$ establish a defined quiescent current through QE1 and QE2.

Inner transistors Q1 and Q2 have a capacitive cross coupling: capacitor C1 connects the base of Q2 to the emitter of Q1, and capacitor C2 connects the base of Q1 to the emitter of Q2. When a signal at the emitter of one of inner transistors Q1 and Q2 changes due to current modulation in one of outer transistors Q3 and Q4, the resulting voltage fluctuation is AC-coupled into the base of the other of inner transistors Q1 and Q2. This produces a regenerative, signal-reinforcing effect. Input-referred voltage noise is reduced without affecting DC biasing, and high input impedance is preserved since the input signal still enters through outer pair Q3-Q4. In some examples, for HDD systems with bandwidths from about 10 MHz to 4 GHZ, cross-coupling capacitors C1 and C2 are sized greater than 2 pF to ensure effective noise suppression and AC coupling performance.

The biasing approach described for the inner bases (Q1 and Q2) with respect to amplifier 480 is also employed in BIMAT amplifier 500. Rather than applying a fixed, low-impedance DC bias, the bias voltage is supplied through a high-impedance path, such as a 5 kΩ resistor in series with a bias voltage source $V_{Bias}$. This establishes a loose DC reference at the base nodes that is sufficient to maintain the correct quiescent operating point but without tightly clamping the voltage. A low impedance bias connection would resist voltage movement at the base and suppress the small signal swings required for proper amplification. By using a bias resistor, as frequency increases, the cross-coupling capacitors $C_X$ present a much lower impedance than the bias resistor, effectively shorting around it for AC signals. This allows the base-emitter cross-coupling to dominate the amplifier AC response while the high impedance resistor continues to maintain the desired DC bias. The $V_{bias}$ reference itself may have a common-mode setpoint defined by a reference voltage $V_{CQEet}$, and may be derived from a floating reference circuit that incorporates common-mode voltage control. In some examples, connections to the bases of Q1 and Q2 are implemented with impedance values greater than 1 kΩ, further supporting loose DC biasing and minimizing base current loading effects.

Amplification proceeds as follows. A differential read signal $V_{IN}$ is developed across the read transducer resistance $R_{TMR}$ and applied across the bases of outer transistors Q3 and Q4, which serve as input nodes to BIMAT amplifier 500. For example, if the voltage at the base of Q3 increases while voltage at the base of Q4 decreases, the base-emitter voltage of Q3 increases and the base-emitter voltage of Q4 decreases. Because the emitter of Q3 is connected to the emitter of inner transistor Q1, an increased base-emitter voltage for Q3 causes a larger emitter current to be injected into the emitter of Q1. The emitter current of Q1, in turn, flows through its collector and the load resistor $R_L$ connected to voltage supply $V_{CS}$. As a result, the voltage at the Q1-Q4 collector node drops due to the increased voltage drop across $R_L$. Conversely, because the base-emitter voltage of Q4 is reduced, less current is injected into Q2 through the shared emitter node, reducing the collector current through Q2. This causes the voltage at the Q2-Q3 collector node to rise due to the decreased voltage drop across its load resistor $R_L$. The resulting voltage difference between the two collector (output) nodes Q1-Q4 and Q2-Q3 forms the differential output signal $V_{OUT}$.

Each collector node is connected to an emitter follower stage: the Q2-Q3 collector node is connected to the base of emitter follower QE1, and the Q1-Q4 collector node is connected to the base of emitter follower QE2. As previously described, emitter followers QE1 and QE2 decouple the voltage noise of amplifier 500 from its input impedance and ensure that voltage noise developed at the amplifier output does not reflect back to affect the input impedance seen by $R_{TMR}$. In addition, QE1 and QE2 buffer the high impedance collector nodes and provide stable drive to the feedback resistors $R_F$, which in turn apply the AC feedback signals to the bases of Q3 and Q4. Emitter followers QE1 and QE2 also minimize the current through feedback resistors $R_F$. Each emitter follower presents a low output impedance and supplies the base drive directly to Q3 and Q4. As a result, the feedback resistors operate primarily in a voltage feedback capacity and do not serve as a significant current path. This allows the use of higher resistance values and contributes to improved noise performance and input impedance stability.

As with amplifier 480, Amplifier 500 provides high input impedance, enhanced signal-to-noise ratio, and strong, linear gain with minimal distortion or peaking. Decoupling the input from the output simplifies the noise, gain, and input impedance equations, which are as follows:

$$\overline{v_{vt}^2} = 4kT\Delta f\left(\frac{5r_b}{2} + \frac{5}{4g_m}\right)$$

-continued $$\overline{v_{di}^2} = R_{TMR}^2 q\Delta f\left(I_B + \frac{I_C}{\beta^2}\right)$$

$$G = \frac{4}{3}g_m R_L$$

$$R_{in} = \frac{2R_F}{1 + \frac{4}{3}g_m R_L + \frac{R_F}{r_\pi}}$$

These expressions show that the voltage noise $$\overline{v_{vt}^2}$$

of BIMAT amplifier 500 is comparable to that of CE+CB−CC amplifier 450. The gain G is simplified and depends linearly on transconductance $g_m$ and load resistance $R_L$, which are both tunable parameters, due to the added emitter follower buffering. The input impedance $R_{in}$ remains tunable via the feedback circuit by setting or trimming the value of $R_F$ and is less sensitive to variations in $g_m$, such that the feedback circuit may be configured so that the input impedance of the amplifier substantially matches the impedance of the transmission line.

In some examples, the read transducer $R_{TMR}$ is not connected to a fixed bias voltage source; rather, the bias voltage across the read transducer is dynamically regulated through a differential feedback loop or biasing circuit incorporating an operational transconductance amplifier (OTA1). OTA1 receives the inverted amplifier output voltage ($-V_{OUT}$) at its differential input terminals and produces an output current proportional to any output voltage imbalance, defined by $I_{OUT}=g_m\ (V^+-V^-)$, where $g_m$ is the transconductance of OTA1. This output current drives a pair of differential current sources $I_{diff}$ that are in signal communication with the read transducer $R_{TMR}$ via the transmission line. Current sources $I_{diff}$ are connected to the bases of Q3 and Q4, which in turn are coupled to the terminals of $R_{TMR}$ through the transmission line. In response to deviations of $V_{OUT}$ from its quiescent center, the $I_{diff}$ current sources source or sink current at the bases of Q3 and Q4, thereby shifting the bias voltage applied across $R_{TMR}$. These current adjustments dynamically re-balance the amplifier output, restoring a zero-centered quiescent state and establishing the correct DC bias across $R_{TMR}$ without relying on fixed bias voltage sources.

OTA1 functions as an active DC feedback control element that senses output imbalance and corrects it by regulating base current at the amplifier input. For example, if $V_{OUT}$ drifts positive, the corresponding negative differential input at OTA1 produces an output current that increases the base current at Q4 and/or decreases the base current at Q3, reducing the amplifier output toward its center. A negative drift in $V_{OUT}$ produces the opposite correction. This feedback mechanism continuously maintains a stable DC operating point. Importantly, OTA1 operates on DC or low frequency deviations and does not interfere with AC signal components. When the read transducer detects a magnetic transition, it induces a transient differential voltage across $R_{TMR}$, which causes a corresponding change in $V_{OUT}$. These rapid variations pass through the amplifier without suppression. OTA1 maintains the underlying DC bias during such events but does not impede dynamic signal swing in response to magnetic transitions, thereby preserving the ability of BIMAT amplifier 500 to respond accurately to magnetic transitions while ensuring DC bias stability.

BIMAT amplifier 500 implements a second control loop or common mode biasing circuit to regulate the common mode voltage $V_{cm}$ at the amplifier input. Resistors $R_{CM1}$ and $R_{CM2}$ are connected in series between the bases of Q3 and Q4 to form a common-mode resistive voltage divider. The center tap between resistors $R_{CM1}$ and $R_{CM2}$ defines a node $V_{cm}$ that represents the average (common mode) voltage of the $R_{TMR}$ terminals. A second operational transconductance amplifier (OTA2) compares $V_{cm}$ to a predefined common-mode reference, typically ground, and adjusts common-mode current sources $I_{cm}$ coupled to the bases of Q3 and Q4. Common-mode current sources $I_{cm}$ shift the base voltages of Q3 and Q4, and thus the voltages at the terminals of $R_{TMR}$ via the transmission line, up or down to maintain the correct average (common-mode) voltage. This prevents deviation of the common-mode level from its intended value (typically ground), which could lead to distortion or imbalance in operation of amplifier 500.

BIMAT amplifier 500 thereby implements two coordinated feedback loops: a differential feedback loop, governed by OTA1, which regulates the amplifier's differential output voltage $V_{OUT}$ to a quiescent value of approximately zero volts; and a common-mode feedback loop, governed by OTA2, which regulates the average (common-mode) input voltage $V_{cm}$ to a reference level, typically ground. Each OTA operates with a distinct control bandwidth—OTA1 with bandwidth BW1 and OTA2 with bandwidth BW2—selected to ensure effective correction of DC and low-frequency deviations while preserving the ability of amplifier 500 to respond to high-frequency signal transitions without interference.

OTA1 and OTA2 operate independently but may be implemented using a shared control architecture. Their outputs may be combined in a common pair of current sources that apply both differential and common-mode corrections. Whether implemented through shared or non-shared hardware, the control functions of OTA1 and OTA2 remain distinct and non-interfering, as they regulate orthogonal signal parameters. OTA1 adjusts the differential voltage across the amplifier input, while OTA2 adjusts the common-mode voltage.

Voltage Regulator for BIMAT Amplifier

Figure 10B:
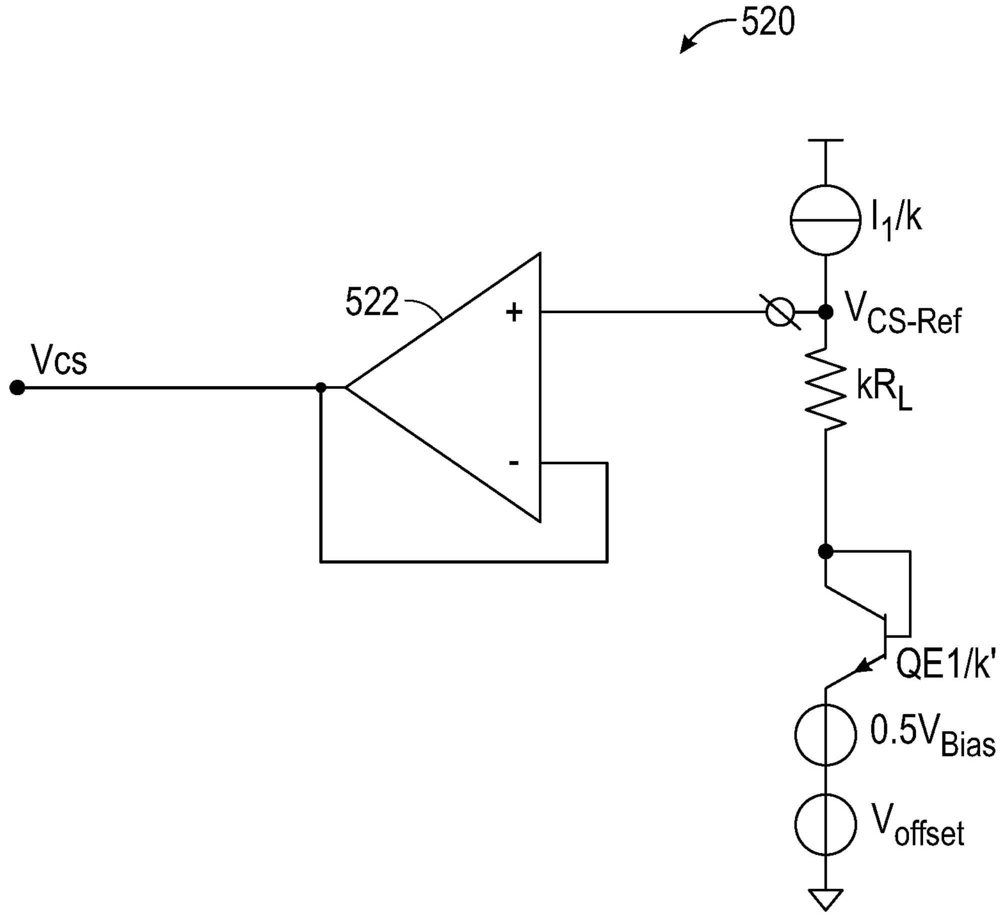
FIG. 10B is a circuit diagram of a voltage regulator configured to generate the supply voltage for the BIMAT amplifier of FIG. 10A, in accordance with aspects of this disclosure.

FIG. 10B is a circuit diagram of a voltage regulator 520 configured to generate the supply voltage $V_{CS}$ for BIMAT amplifier 500, in accordance with aspects of this disclosure. Voltage regulator 520 produces a supply voltage $V_{cs}$ that ensures proper headroom for emitter followers QE1 and QE2 and incorporates scaling to reduce current and power requirements of regulator 520. Functionally, regulator 520 replicates the upper signal path of amplifier 500 in a scaled-down form with reduced current levels. It includes a scaled current source, a proportionally-scaled load resistor, and a scaled reference transistor configured to mirror the quiescent operating conditions of amplifier 500. Specifically, regulator 520 sets the power supply $V_{CS}$ such that the collectors of emitter followers QE1 and QE2 remain near the input common mode voltage ($V_{CM}$) of amplifier 500.

Voltage regulator 520 comprises a bias current source $I_1/k$ that is scaled by a factor of 1/k relative to the bias current $I_1$ of amplifier 500 that sinks source current into a load resistor $kR_L$ that is scaled by a factor of k relative to the load resistor of the amplifier. The use of scaling factors k and k' (for the reference transistor) reduces current and power consumption while preserving the voltage conditions required to bias amplifier 500. Bias current source $I_1/k$ is scaled down by a factor of k relative to the full scale bias current $I_1$ and load resistor $kR_L$ is scaled up by the same factor k. This reciprocal scaling maintains a constant voltage drop across the resistor, since V=IR remains unchanged. The scaling factors thus allow regulator 520 to operate at lower power while preserving the voltage relationships necessary for proper biasing of amplifier 500.

Reference transistor QE1/*k'* functions as a scaled counterpart to emitter follower QE1 in the main amplifier. It is scaled by factor k' to match the reduced current flowing through the regulator branch while preserving the same base-emitter voltage drop as the unscaled emitter followers QE1 and QE2 operating at full current. The base and collector of QE1/*k'* are tied together and to the lower terminal of resistor kRL, forming a diode-connected BJT configuration. This arrangement causes QE1/*k'* to adjust its base-emitter voltage to support the imposed current, thereby establishing a reference voltage proportional to the bias conditions in the main amplifier.

The emitter of QE1/*k'* is connected in series with two voltage sources: a first voltage source providing a common-mode bias voltage ($0.5V_{Bias}$) and a second voltage source providing an offset voltage ($V_{Offset}$). The common-mode bias voltage source ($0.5V_{Bias}$) source reflects the common-mode input voltage ($V_{CM}$) of amplifier 500 that is present at the bases of Q3 and Q4. Since QE1 and QE2 are emitter followers that drive the feedback resistors $R_F$ terminating at those base nodes, their emitters must closely track this common-mode voltage to preserve signal symmetry and avoid biasing errors. The offset voltage source ($V_{Offset}$) establishes sufficient voltage headroom to maintain active region operation of all BJTs within amplifier 500. Together, $0.5V_{Bias}$ and $V_{Offset}$ establish a stable emitter potential for QE1/*k'*, which in turn sets the appropriate base voltage (through its diode connection) and the voltage drop across resistor $kR_L$. This configuration ensures that the resulting reference voltage $V_{CS\text{-}Ref}$ reflects the supply conditions required to support the full-scale operation of QE1 and QE2 in amplifier 500.

The supply voltage $V_{CS}$ for BIMAT amplifier 500 is derived from the reference node $V_{CS\text{-}Ref}$ at the junction between current source $I_1/k$ and resistor $kR_L$. The value of $V_{CS\text{-}Ref}$ is governed by the voltage drop across QE1/*k'* and the series-connected voltage sources. $V_{CS\text{-}Ref}$ is applied to the non-inverting input of buffer amplifier 522, which is configured as a unity-gain buffer (voltage follower). The inverting input of amplifier 522 is connected to its output, such that its output voltage $V_{CS}$ tracks $V_{CS\text{-}Ref}$ Because amplifier 522 is configured with negative feedback, it maintains a low output impedance, enabling Vos to remain stable under varying load conditions. This low-impedance supply maintains a constant collector potential for emitter followers QE1 and QE2. Thus, regulator 200 implements a form of feedforward power supply control, wherein the reference voltage $V_{CS\text{-}Ref}$ is used to set the output supply voltage $V_{CS}$ directly, rather than through feedback derived from the main amplifier output.

In some examples, the emitter follower bias current $I_{EF}$ is set equal to the regulator reference current $I_1$, in which case the scaling factor k' equals k. If $I_{EF}$ differs from $I_1$, then k' is adjusted proportionally according to the relation $k'=(I_{EF}/I_1)\times k$. This adjustment ensures that reference transistor QE1/*k'* exhibits the same base-emitter voltage as full-scale emitter followers QE1 and QE2 despite differences in operating current. In addition to current scaling, the device sizes of QE1-Q3 and QE2-Q4 in the main amplifier are typically matched to maintain symmetrical operation. If different device sizes are used, additional scaling may be needed to ensure correct biasing.

Voltage regulator 520 enables BIMAT amplifier 500 to operate with full DC coupling throughout its signal path. This avoids the need for large AC coupling capacitors, which are impractical to integrate on chip and contribute undesirable parasitic capacitance. By providing stable bias conditions at the power supply rail, regulator 520 supports emitter follower buffering and the transducer bias loop.

Pseudo-Floating Emitter Followers

Figure 10C:
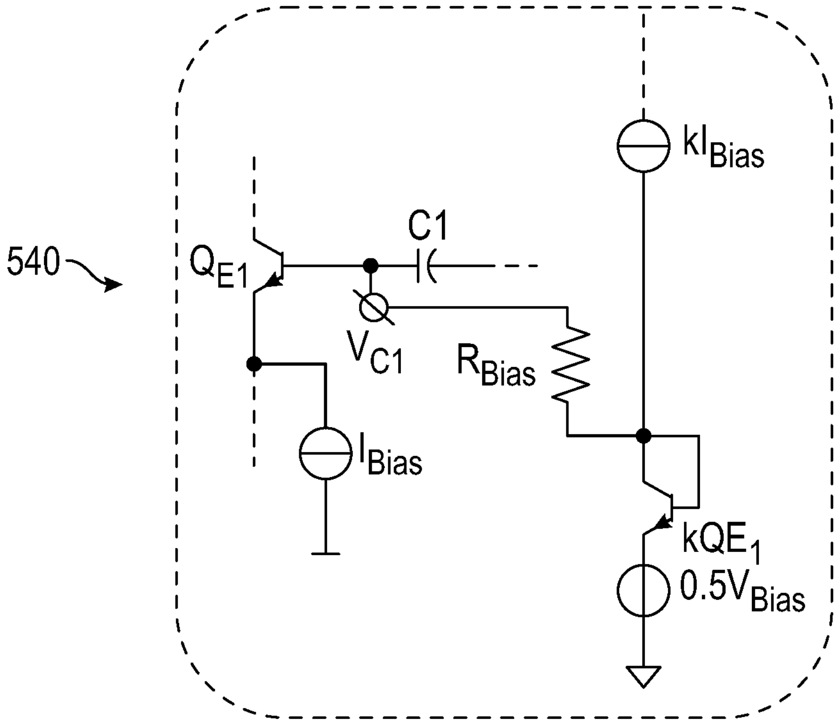
FIGS. 10C and 10D are circuit diagrams of pseudo-floating emitter follower biasing circuits applied to the emitter followers of BIMAT amplifier of FIG. 10A, in accordance with aspects of this disclosure.
Figure 10D:
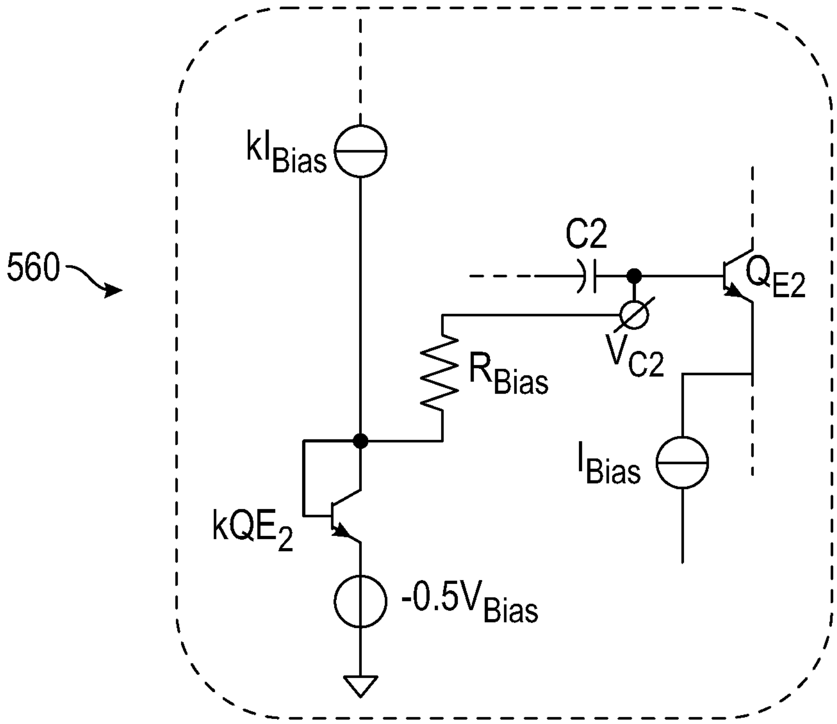

FIGS. 10C and 10D are circuit diagrams of pseudo-floating emitter follower biasing circuits 540 and 560 respectively applied to QE1 and QE2 of BIMAT amplifier 500, according to aspects of this disclosure. Emitter follower biasing circuits 540 and 560 modify the biasing arrangement of emitter followers QE1 and QE2 as depicted in FIG. 10A by replacing emitter bias current sources $I_{EF}$ with emitter follower biasing circuits that provide a "loose" DC reference while maintaining AC coupling to the signal path.

With reference to emitter follower bias circuit 540 of FIG. 10C, emitter follower QE1 is biased through a structure that mirrors the scaled biasing approach described with reference to voltage regulator 520 of FIG. 10B. A scaled reference transistor kQE1 has its collector and base tied together, forming a diode-connected reference transistor. The emitter of kQE1 is biased to common-mode voltage source $0.5V_{Bias}$, which corresponds to the input common-mode voltage of amplifier 500. A scaled bias current source $kI_{Bias}$ is coupled to the collector-base junction of kQE1, providing a reduced current consistent with the scaling factor applied to the transistor. Bias resistor $R_{Bias}$ is connected between the collector-base junction of kQE1 and base node $V_{C1}$ of emitter follower QE1. AC coupling capacitor C1 is coupled between $V_{C1}$ and the rest of amplifier 500, permitting AC signal transmission while blocking DC.

Emitter follower bias circuit 560 of FIG. 10D applies a symmetric configuration to emitter follower QE2. A scaled reference transistor kQE2 has its collector and base tied together and is biased at its emitter by a common-mode voltage source $-0.5V_{Bias}$, and a scaled bias current source $kI_{Bias}$ is applied to the collector-base node. Bias resistor $R_{Bias}$ is connected between the collector-base junction of kQE2 and base node $V_{C2}$ of emitter follower QE2. AC coupling capacitor C2 is coupled between $V_{C2}$ and the rest of amplifier 500, permitting AC signal transmission while blocking DC.

Emitter follower bias circuits 540 and 560 together implement a pseudo floating emitter follower architecture, in which the bias conditions for QE1 and QE2 are set by scaled transistors and bias resistors rather than fixed current sinks. Positioning AC coupling capacitors C1 and C2 between the $V_{C1}$ and $V_{C2}$ nodes and the rest of the signal path enables AC feedback signals to pass through without directly coupling the DC bias voltages. Emitter follower bias circuits 540 and 560 allow the DC operating point of the emitter followers to float slightly in response to circuit conditions, avoiding hard clamping of the bias and preserving headroom for signal swing. They also support AC feedback without introducing large DC currents through feedback resistors $R_F$.

The choice of $0.5V_{Bias}$ and $-0.5V_{Bias}$ as common-mode voltage sources for kQE1 and kQE2 sets the operating points of QE1 and QE2 near the common-mode input voltage $V_{cm}$. The bias resistor $R_{Bias}$ sets the impedance seen at the bases of QE1 and QE2 and provides a loose bias connection that avoids tightly constraining the base voltage. Emitter follower biasing circuits 540 and 560 are compatible with wide bandwidth applications and support AC-coupled feedback paths without introducing large on-chip coupling capacitors. They are also suitable for cascode integration at the collector terminals of QE1 and QE2 if desired for enhanced bandwidth.

The methods and flow diagrams disclosed herein are implemented by control circuitry 22, which may be implemented partially or wholly in one or more processing devices such as a PLSI, an integrated circuit (IC) such as a system-on-a-chip (SOC), arm electronics, and/or any other suitable circuitry or controller. Control circuitry 22 may further comprise a microprocessor executing instructions operable to perform the methods and flow diagrams described herein. The instructions may be stored in a computer-readable medium, such as a non-volatile semiconductor memory device that may be external to the microprocessor or integrated with the microprocessor in an SOC. The instructions may alternatively be stored on a disk and read into a volatile semiconductor memory when the HDD is powered on. Control circuitry 22 may comprise logic circuitry such as state machine circuitry or other suitable logic circuitry. The methods and flow diagrams disclosed herein may be implemented using analog circuitry, digital circuitry, or a combination thereof.

One or more processing devices may comprise control circuitry 22 and may perform, individually and/or collectively, some or all of the functions of control circuitry 22. Such processing devices may be part of the HDD and/or abstracted away from physically proximity to the HDD. Such processing devices may be part of or proximate to one or more unitary products, racks comprising multiple data storage devices, physical or virtual servers, local area networks, storage area networks, data centers, and/or cloud services. Disk drives or HDDs as disclosed herein may include magnetic, optical, hybrid, or other types of disk drives. Devices such as computing devices, data servers, media content storage devices, and other devices may comprise the storage media and control circuitry described herein.

While certain embodiments are described herein, these embodiments are presented by way of example only, and do not limit the scope of this disclosure. Various omissions, substitutions and changes may be made without departing from the spirit and scope of this disclosure. The methods and processes described herein are not limited to any particular sequence and may be used independently or combined in various ways. Some method or process steps may be omitted and other steps added in some implementations. Nothing in this description implies that any particular feature, component, characteristic, or step is necessary or indispensable. Many variations, modifications, additions, and improvements are possible and fall within the scope of this disclosure as defined by the following claims.

The invention claimed is:

1. A data storage device comprising:

magnetic media;

a recording head comprising a read transducer configured to generate a differential read signal in response to magnetic bit transitions on the magnetic media; and an amplifier coupled to the recording head via a transmission line and comprising:

a first pair of bipolar junction transistors (BJTs), wherein bases of the first pair of BJTs define input nodes configured to receive the differential read signal from the read transducer via the transmission line;

a second pair of BJTs, wherein bases of the second pair of BJTs are coupled to a bias voltage source, emitters of the second pair of BJTs are coupled to emitters of the first pair of BJTs, and collectors of the second pair of BJTs are cross-coupled to collectors of the first pair of BJTs to define output nodes at which a differential output signal of the amplifier is formed;

a feedback resistor and an emitter follower coupled between the output nodes and the input nodes, wherein an input impedance of the amplifier is tuned by the feedback resistor; and a differential biasing circuit comprising an operational transconductance amplifier (OTA) configured to receive the differential output signal and to drive a pair of differential current sources coupled to the input nodes to apply a differential bias voltage across the read transducer via the transmission line.

2. The data storage device of claim 1, wherein the OTA is further configured to receive an inverted version of the differential output signal and to regulate the differential output signal toward a quiescent value of approximately zero volts.

3. The data storage device of claim 1, wherein the emitters of the second pair of BJTs are capacitively cross-coupled to the bases of the second pair of BJTs.

4. The data storage device of claim 1, wherein the amplifier further comprises a voltage regulator configured to generate a supply voltage for the amplifier, the voltage regulator comprising:

a scaled bias current source;

a scaled load resistor coupled in series with the scaled bias current source;

a scaled reference BJT having a collector and a base coupled to the scaled load resistor and defining a reference node at which a reference supply voltage is developed;

at least one voltage source coupled to an emitter of the scaled reference BJT; and a buffer amplifier having an input coupled to the reference node and an output at which the supply voltage is developed.

5. The data storage device of claim 4, wherein the at least one voltage source comprises:

a common-mode bias voltage source corresponding to an input common-mode voltage of the amplifier; and an offset voltage source configured to establish sufficient voltage headroom to maintain active region operation of the BJTs within the amplifier.

6. The data storage device of claim 4, wherein the scaled bias current source is scaled by a factor of 1/k relative to a bias current source of the amplifier;

the scaled load resistor is scaled by a factor of k relative to a load resistor of the amplifier; and the scaled reference BJT is scaled by a factor of 1/k', wherein $k'=(I_{EF}/I_1)\times k$, $I_{EF}$ is a bias current applied to the emitter follower, and $I_1$ is a bias current applied to the emitters of the first and second pairs of BJTs.

7. The data storage device of claim 1, wherein the amplifier further comprises an emitter follower biasing circuit configured to set a base voltage of the emitter follower, the emitter follower biasing circuit comprising:

a scaled reference transistor;

a scaled bias current source coupled to a collector and to a base of the scaled reference transistor; and a bias resistor coupled between the collector and the base of the scaled reference transistor and a base of the emitter follower.

8. The data storage device of claim 7, further comprising an alternating current (AC) coupling capacitor coupled to the base of the emitter follower.

9. A data storage device comprising:

a magnetic media;

a recording head comprising a read transducer configured to generate a differential read signal in response to magnetic bit transitions on the magnetic media; and an amplifier coupled to the recording head via a transmission line and comprising:

a first pair of bipolar junction transistors (BJTs), wherein bases of the first pair of BJTs define input nodes configured to receive the differential read signal from the read transducer via the transmission line;

a second pair of BJTs, wherein bases of the second pair of BJTs are coupled to a bias voltage source, emitters of the second pair of BJTs are coupled to emitters of the first pair of BJTs, and collectors of the second pair of BJTs are cross-coupled to collectors of the first pair of BJTs to define output nodes at which a differential output signal of the amplifier is formed;

a feedback resistor and an emitter follower coupled between the output nodes and the input nodes, wherein an input impedance of the amplifier is tuned by the feedback resistor; and a common-mode biasing circuit comprising an operational transconductance amplifier (OTA) configured to compare a common-mode input voltage of the input nodes to a reference voltage and to drive a pair of common-mode current sources coupled to the input nodes to regulate the common-mode input voltage.

10. The data storage device of claim 9, wherein the common-mode biasing circuit further comprises a common-mode resistive voltage divider connected between the input nodes having a midpoint from which the OTA obtains the common-mode input voltage of the input nodes.

11. The data storage device of claim 9, wherein the amplifier further comprises a differential biasing circuit comprising a second OTA configured to receive the differential output signal and to drive a pair of differential current sources coupled to the input nodes to apply a differential bias voltage across the read transducer via the transmission line.

12. The data storage device of claim 11, wherein the second OTA is further configured to receive an inverted version of the differential output signal and to regulate the differential output signal toward a quiescent value of approximately zero volts.

13. The data storage device of claim 9, wherein the amplifier further comprises a voltage regulator configured to generate a supply voltage for the amplifier, the voltage regulator comprising:

a scaled bias current source;

a scaled load resistor coupled in series with the scaled bias current source;

a scaled reference BJT having a collector and a base coupled to the scaled load resistor and defining a reference node at which a reference supply voltage is developed;

at least one voltage source coupled to an emitter of the scaled reference BJT; and a buffer amplifier having an input coupled to the reference node and an output at which the supply voltage is developed.

14. The data storage device of claim 13, wherein the at least one voltage source comprises:

a common-mode bias voltage source corresponding to an input common-mode voltage of the amplifier; and an offset voltage source configured to establish sufficient voltage headroom to maintain active region operation of the BJTs within the amplifier.

15. The data storage device of claim 13, wherein the scaled bias current source is scaled by a factor of 1/k relative to a bias current source of the amplifier;

the scaled load resistor is scaled by a factor of k relative to a load resistor of the amplifier; and the scaled reference BJT is scaled by a factor of 1/k', wherein $k'=(I_{EF}/I_1)\times k$, $I_{EF}$ is a bias current applied to the emitter follower, and $I_1$ is a bias current applied to the emitters of the first and second pairs of BJTs.

16. The data storage device of claim 9, wherein the amplifier further comprises an emitter follower biasing circuit configured to set a base voltage of the emitter follower, the emitter follower biasing circuit comprising:

a scaled reference transistor;

a scaled bias current source coupled to a collector and to a base of the scaled reference transistor; and a bias resistor coupled between the collector and the base of the scaled reference transistor and a base of the emitter follower.

17. A method for amplifying a differential read signal generated across a read transducer of a data storage device, the method comprising:

applying the differential read signal across input nodes defined by bases of a first pair of bipolar junction transistors (BJTs);

amplifying the differential read signal using a second pair of BJTs having emitters coupled to emitters of the first pair of BJTs;

forming a differential output signal at output nodes defined by cross-coupled collectors of the first and second pairs of BJTs;

feeding the differential output signal back to the input nodes through a feedback resistor and an emitter follower, wherein the feedback resistor is configured to tune an input impedance of the amplifier;

regulating a differential bias voltage across the read transducer based on the differential output signal; and regulating a common-mode voltage at the input nodes based on a voltage sensed at a center tap of a resistive divider connected between the input nodes.

18. The method of claim 17, wherein regulating the differential bias voltage comprises:

receiving the differential output signal with an operational transconductance amplifier (OTA); and driving a pair of differential current sources coupled to the input nodes to apply the differential bias voltage across the read transducer via a transmission line.

19. The method of claim 17, wherein regulating the common-mode voltage comprises:

comparing a common-mode input voltage of the input nodes to a reference voltage with an operational transconductance amplifier (OTA); and driving a pair of common-mode current sources coupled to the input nodes to regulate the common-mode input voltage.

20. The method of claim 17, further comprising:

regulating a supply voltage such that the collector of the emitter follower remains near the common-mode voltage.

* * * * *